(12) United States Patent
Vasquez et al.

(10) Patent No.: US 11,188,688 B2
(45) Date of Patent: *Nov. 30, 2021

(54) ADVANCED AUTOMATED PROCESS FOR THE WING-TO-BODY JOIN OF AN AIRCRAFT WITH PREDICTIVE SURFACE SCANNING

(71) Applicant: The Boeing Company, Chicago, IL (US)

(72) Inventors: Christina Michelle Vasquez, Mukilteo, WA (US); Dario I. Valenzuela, Mukilteo, WA (US); Ronald J. Collins, Brier, WA (US); Aksel Bode, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 323 days.

This patent is subject to a terminal disclaimer.

(21) Appl. No.: 16/293,377

(22) Filed: Mar. 5, 2019

(65) Prior Publication Data

US 2019/0205501 A1 Jul. 4, 2019

Related U.S. Application Data

(63) Continuation of application No. 14/935,190, filed on Nov. 6, 2015, now Pat. No. 10,275,565.

(51) Int. Cl.
*B64F 5/10* (2017.01)
*B64C 1/26* (2006.01)
(Continued)

(52) U.S. Cl.
CPC ............ *G06F 30/15* (2020.01); *B64C 1/26* (2013.01); *B64F 5/10* (2017.01); *G05B 19/402* (2013.01)

(58) Field of Classification Search
CPC ...... B64F 5/10; G05B 19/402; G05B 19/4097; B64C 1/26; G06F 30/15
(Continued)

(56) References Cited

U.S. PATENT DOCUMENTS 4,071,744 A 1/1978 Pollock
4,488,137 A 12/1984 Rooney et al.
(Continued)

FOREIGN PATENT DOCUMENTS

CA 2816266 1/2013
CN 101583536 1/2009
(Continued)

OTHER PUBLICATIONS

Richey, M., McIvor, R., and Sandwith, S., "Computer Aided Design Manufacturing & Measurement Integration (Presentation)," *Coordinate Measurement System Committee*, Aug. 13-17, 2001.
(Continued)

*Primary Examiner* — Thai Q Phan
(74) *Attorney, Agent, or Firm* — Dascenzo Gates Intellectual Property Law, P.C.

(57) ABSTRACT

Disclosed aircraft wing-to-body join methods include measuring a 3D surface contour of each wing root interface surface of a wing root to form a complete wing root 3D surface profile; measuring a 3D surface contour of each wing stub interface surface of a wing stub to form a complete wing stub 3D surface profile; calculating a virtual fit between the aircraft wing and the aircraft body assembly that defines one or more gaps between the wing root interface surface and the wing stub interface surface; and aligning the aircraft wing to the aircraft body assembly to achieve a real fit consistent with the virtual fit.

27 Claims, 7 Drawing Sheets

(51) Int. Cl.
*G06F 30/15* (2020.01)
*G05B 19/402* (2006.01)

(58) Field of Classification Search
USPC .............................. 703/2, 5, 6; 259/227.14
See application file for complete search history.

(56) References Cited

U.S. PATENT DOCUMENTS

| | | |
|---|---|---|
| 4,512,837 A | 4/1985 | Sarh et al. |
| 4,719,586 A | 1/1988 | Moyer et al. |
| 4,759,074 A | 7/1988 | Ladipaolo et al. |
| 4,848,137 A | 7/1989 | Turner et al. |
| 4,956,764 A | 9/1990 | Carver et al. |
| 5,005,277 A | 4/1991 | Uemura et al. |
| 5,106,290 A | 4/1992 | Carver et al. |
| 5,168,453 A | 12/1992 | Nomaru et al. |
| 5,208,763 A | 5/1993 | Hong et al. |
| 5,380,978 A | 1/1995 | Pryor |
| 5,633,494 A | 5/1997 | Danisch |
| 5,828,566 A | 10/1998 | Pryor |
| 5,910,894 A | 6/1999 | Pryor |
| 5,988,862 A | 11/1999 | Kacyra et al. |
| 6,031,612 A | 2/2000 | Shirley |
| 6,088,663 A | 7/2000 | Wang |
| 6,237,210 B1 | 5/2001 | Stoewer et al. |
| 6,354,152 B1 | 3/2002 | Herlick |
| 6,505,393 B2 | 1/2003 | Stoewer et al. |
| 6,618,505 B2 | 9/2003 | Cork et al. |
| 6,731,990 B1 | 5/2004 | Carter et al. |
| 6,811,733 B2 | 10/2004 | Nelson et al. |
| 6,829,516 B2 | 12/2004 | Popp et al. |
| 6,877,203 B2 | 4/2005 | Engstrom et al. |
| 6,892,160 B2 | 5/2005 | Gooch et al. |
| 6,901,673 B1 | 6/2005 | Cobb et al. |
| 7,110,956 B1 | 9/2006 | Drake, Jr. et al. |
| 7,194,326 B2 | 3/2007 | Cobb et al. |
| 7,239,991 B2 | 7/2007 | Tuszynski |
| 7,487,901 B2 | 2/2009 | Talwar et al. |
| 7,565,206 B2 | 7/2009 | Palti |
| 7,587,258 B2 | 9/2009 | Marsh et al. |
| 7,621,701 B2 | 11/2009 | Skiles et al. |
| 7,660,642 B1 | 2/2010 | Tuszynski |
| 7,730,789 B2 | 6/2010 | Odendahl |
| 7,756,321 B2* | 7/2010 | Marsh .................. B64F 5/10 |
| | | 382/152 |
| 7,783,376 B2 | 8/2010 | Marsh et al. |
| 7,787,979 B2 | 8/2010 | Marsh et al. |
| 7,974,722 B2 | 7/2011 | Boyl-Davis et al. |
| 8,177,169 B2 | 5/2012 | Barros et al. |
| 8,185,238 B2 | 5/2012 | Gonzalez Sainz et al. |
| 8,272,046 B2* | 9/2012 | Gundavelli ......... H04L 12/4641 |
| | | 726/15 |
| 8,272,118 B2 | 9/2012 | Alvez |
| 8,327,543 B2 | 12/2012 | Lafon |
| 8,452,441 B2 | 5/2013 | Jang et al. |
| 8,498,727 B1 | 7/2013 | Tuszynski |
| 8,557,165 B2 | 10/2013 | Jones et al. |
| 8,620,470 B2 | 12/2013 | Cobb et al. |
| 8,634,950 B2 | 1/2014 | Simonetti et al. |
| 8,740,151 B1 | 6/2014 | Rosman et al. |
| 8,756,792 B2* | 6/2014 | Boyl-Davis .............. B64C 1/26 |
| | | 29/592 |
| 8,857,765 B2 | 10/2014 | Thomas et al. |
| 8,882,046 B2 | 11/2014 | Edsall et al. |
| 9,213,786 B2 | 12/2015 | Glasscock et al. |
| 9,733,626 B2 | 8/2017 | Friman et al. |
| 9,910,497 B2 | 3/2018 | Kramer et al. |
| 9,937,623 B2 | 4/2018 | Vasquez et al. |
| 9,952,580 B2* | 4/2018 | Bode .................. G05B 19/4097 |
| 10,054,927 B2 | 8/2018 | Saulsbury et al. |
| 10,139,808 B2 | 11/2018 | Engelbart et al. |
| 10,183,329 B2 | 1/2019 | Gunther |
| 10,275,565 B2* | 4/2019 | Vasquez .................. B64C 1/26 |
| 10,324,426 B2 | 6/2019 | Nakashima et al. |
| 10,353,959 B2 | 7/2019 | Morimoto |
| 10,387,532 B2 | 8/2019 | Soga |
| 2002/0166220 A1 | 11/2002 | Imundo et al. |
| 2003/0031383 A1 | 2/2003 | Gooch |
| 2003/0090682 A1 | 5/2003 | Gooch et al. |
| 2004/0030436 A1 | 2/2004 | Popp et al. |
| 2005/0015169 A1 | 1/2005 | Littlejohn et al. |
| 2005/0033464 A1 | 2/2005 | Nguyen |
| 2005/0100263 A1 | 5/2005 | Shi et al. |
| 2005/0192695 A1 | 9/2005 | Yoshida et al. |
| 2005/0288812 A1 | 12/2005 | Cheng et al. |
| 2006/0052977 A1 | 3/2006 | Wilson |
| 2006/0106572 A1 | 5/2006 | Eichblatt et al. |
| 2006/0137164 A1* | 6/2006 | Kraus .................. B25J 9/1684 |
| | | 29/407.1 |
| 2006/0218107 A1 | 9/2006 | Young |
| 2007/0039155 A1 | 2/2007 | Savoy |
| 2007/0244644 A1 | 10/2007 | Tanahashi |
| 2008/0183412 A1 | 7/2008 | Funk et al. |
| 2008/0205763 A1* | 8/2008 | Marsh ...................... B64F 5/10 |
| | | 382/190 |
| 2008/0281557 A1 | 11/2008 | Emigholz |
| 2009/0138223 A1 | 5/2009 | Kim et al. |
| 2010/0010655 A1 | 1/2010 | Corcoran et al. |
| 2010/0082143 A1 | 4/2010 | Pantaleano et al. |
| 2010/0304039 A1 | 12/2010 | Bausen et al. |
| 2011/0078885 A1 | 4/2011 | DeRoche et al. |
| 2011/0178622 A1 | 7/2011 | Tuszynski |
| 2011/0276169 A1 | 11/2011 | Bourg, Jr. et al. |
| 2011/0276172 A1 | 11/2011 | Cobb et al. |
| 2011/0282480 A1 | 11/2011 | Jang et al. |
| 2012/0016643 A1 | 1/2012 | Jang et al. |
| 2012/0136470 A1 | 5/2012 | Deans et al. |
| 2012/0202664 A1 | 8/2012 | Brown et al. |
| 2012/0204671 A1 | 8/2012 | Tesar |
| 2013/0041596 A1 | 2/2013 | DeRoche et al. |
| 2013/0268238 A1 | 10/2013 | McCready |
| 2013/0326851 A1 | 12/2013 | Woodhull et al. |
| 2014/0052425 A1 | 2/2014 | Selvaraj et al. |
| 2014/0294498 A1 | 10/2014 | Logan |
| 2014/0302938 A1* | 10/2014 | Lidak ...................... B64C 27/41 |
| | | 464/125 |
| 2014/0303764 A1 | 10/2014 | Boyl-Davis et al. |
| 2014/0353305 A1 | 12/2014 | Matsen et al. |
| 2014/0365061 A1 | 12/2014 | Vasquez et al. |
| 2015/0024233 A1 | 1/2015 | Gunther |
| 2016/0091888 A1 | 3/2016 | Doyle et al. |
| 2016/0158940 A1 | 6/2016 | Brockway et al. |
| 2016/0185056 A1 | 6/2016 | Beacham et al. |
| 2016/0207638 A1 | 7/2016 | Valenzuela et al. |
| 2016/0221692 A1 | 8/2016 | Pirro et al. |
| 2016/0325851 A1 | 11/2016 | Turner et al. |
| 2016/0334778 A1 | 11/2016 | Cope |
| 2017/0094812 A1 | 3/2017 | Leggett et al. |
| 2017/0132355 A1* | 5/2017 | Vasquez .................... B64C 1/26 |
| 2017/0138385 A1 | 5/2017 | Clark et al. |
| 2017/0206469 A1 | 7/2017 | Das et al. |
| 2017/0210489 A1* | 7/2017 | Bode ........................ B64F 5/10 |
| 2017/0316339 A1 | 11/2017 | Li et al. |
| 2017/0329874 A1 | 11/2017 | Morimoto |
| 2018/0050824 A1 | 2/2018 | Regnault et al. |
| 2018/0082002 A1 | 3/2018 | Demena et al. |
| 2018/0107194 A1 | 4/2018 | Erion et al. |
| 2018/0113425 A1 | 4/2018 | Nakashima et al. |
| 2018/0150038 A1 | 5/2018 | Lin et al. |
| 2018/0284739 A1 | 10/2018 | Ueda et al. |
| 2018/0307481 A1 | 10/2018 | Ganesan et al. |
| 2019/0072932 A1 | 3/2019 | Sitnikov et al. |
| 2019/0152621 A1 | 5/2019 | Esteban Finck et al. |
| 2019/0265021 A1 | 8/2019 | Valenzuela et al. |
| 2019/0278261 A1 | 9/2019 | Shibuya |
| 2019/0350161 A1 | 11/2019 | Yoshinage |
| 2019/0382135 A1 | 12/2019 | Gonzalez et al. |

FOREIGN PATENT DOCUMENTS

| | | |
|---|---|---|
| CN | 102112845 | 6/2011 |
| CN | 103901852 | 7/2014 |
| CN | 103991555 | 8/2014 |
| DE | 697 33 941 | 6/2006 |

(56) References Cited

FOREIGN PATENT DOCUMENTS

| | | |
|---|---|---|
| DE | 202014101000 | 7/2015 |
| EP | 0 147 066 | 4/1987 |
| EP | 0 957 336 | 11/1999 |
| EP | 0 976 472 | 2/2000 |
| EP | 0 888 202 | 10/2005 |
| EP | 1 719 030 | 10/2008 |
| EP | 2 368 799 | 9/2011 |
| EP | 2 939 786 | 11/2015 |
| EP | 3244329 | 11/2017 |
| EP | 3636553 | 4/2020 |
| WO | WO 00/45231 | 4/2000 |
| WO | WO 2013/117971 | 8/2013 |

OTHER PUBLICATIONS

Richey, M., McIvor, R., and Sandwith, S., "Computer Aided Design Manufacturing & Measurement Integration (Paper)," *Coordinate Measurement System Committee*, Aug. 13-17, 2001.

Calkins, J.M., "Quantifying Coordinate Uncertainty Fields in Coupled Spatial Measurement Systems," *Doctoral dissertation submitted to Virginia Polytechnic Institute and State University*, Jul. 30, 2002.

Olexa, R., "Measuring the Big Stuff," *Manufacturing Engineering*, vol. 130, No. 4, Apr. 2003.

Flynn, R. and Horky, S., "Automated Metrology in a Business Jet Final Assembly Line," *The Journal of the CMSC*, vol. 10, No. 1, Spring 2015.

English-language abstract of European Patent No. EP 0 976 472 downloaded from Espacenet.com on Apr. 29, 2014.

U.S. Appl. No. 16/152,243, filed Oct. 4, 2018, Borowicz.

China National Intellectual Property Administration, First Office Action and Search Report for related China Patent Application No. 2016108985941, dated Mar. 10, 2021.

English language translation of China National Intellectual Property Administration, First Office Action and Search Report for related China Patent Application No. 2016108985941, dated Mar. 10, 2021.

Machine-generated English language translation of the abstract of CN 101583536, downloaded from Espacenet.com on Apr. 21, 2021.

Machine-generated English language translation of the abstract of CN 102112845, downloaded from Espacenet.com on Apr. 21, 2021.

Machine-generated English language translation of the abstract of CN 103901852, downloaded from Espacenet.com on Apr. 21, 2021.

Machine-generated English language translation of the abstract of CN 103991555, downloaded from Espacenet.com on Apr. 21, 2021.

Machine-generated English language translation of the abstract of DE 202014101000, downloaded from Google Patents on Apr. 21, 2021.

\* cited by examiner

ADVANCED AUTOMATED PROCESS FOR THE WING-TO-BODY JOIN OF AN AIRCRAFT WITH PREDICTIVE SURFACE SCANNING

RELATED APPLICATION

The present application is a continuation of and claims priority to U.S. patent application Ser. No. 14/935,190, filed on Nov. 6, 2015, entitled "ADVANCED AUTOMATED PROCESS FOR THE WING-TO-BODY JOIN OF AN AIRCRAFT WITH PREDICTIVE SURFACE SCANNING," the complete disclosure of which is incorporated herein by reference.

FIELD

The present disclosure relates to automated assembly systems and methods.

BACKGROUND

Aircraft assembly includes fitting together many complex and often large components in precise relationships. For example, wings and tail planes (e.g., vertical stabilizer, horizontal stabilizer) may be assembled substantially whole and then attached to the corresponding section of the aircraft body. As another example, the fuselage of an aircraft may be the combination of several body assemblies where each body assembly is a barrel section of the fuselage. Some components, including some very large components such as the wings, fuselage sections, and tail assemblies, are designed to be assembled with high accuracy, e.g., with relative positional tolerances between parts of less than 0.005 inch (about 0.1 millimeters).

Shims are used extensively in the aircraft industry to fit and join together large components. Shims, also called fillers, are used to fill gaps (or voids) between joined parts. Gaps may be designed gaps that are designed to allow for manufacturing tolerance, alignment of components, and proper aerodynamic assembly of the aircraft. Shims may be individually sized to fit the corresponding gap with high accuracy (e.g., with a residual gap of less than 0.005 inch (about 0.1 millimeters)). The use of shims to fill gaps between mating parts results in more accurately assembled and more structurally sound aircraft.

Typically, each shim for a gap is custom fit to the individual parts being assembled. Design and fabrication of unique shims for each aircraft can be a time consuming and labor intensive process. Shim design and installation may be time consuming enough to significantly impact the speed of aircraft assembly.

One method to determine the proper shim size involves bringing the parts together in a test fit, identifying each gap, and measuring each gap to determine the dimensions and shapes of the custom shims. The sizes and shapes of gaps are probed by feeler gauges. Use of manual feeler gauges involves a progressive trial-and-error technique while use of electronic feeler gauges may be more automatic, yet still require placing the gauge in each gap to be measured. The feeler gauge approach is time consuming and tedious, and its accuracy may be dependent on the skill and experience of the person making the measurements. Incorrect measurements may result in ill-fitting shims which would lead to repeated measurements and production of shims until the proper fit is achieved.

Another method of fitting the gaps between mating parts, sometimes referred to as predictive shimming, involves scanning the interfacing part surfaces in an attempt to predict the exact shape of the gap between these surfaces. The parts are virtually fitted together based upon the engineering design. Shims are fabricated based on the virtual fit. A drawback of this approach is that the parts, especially large assemblies, may not fit together in the manner predicted virtually and, hence, the predicted shim shapes would be inappropriate. The parts may not fit together as expected because of deviations from the engineering design (even when the deviations are within tolerance), inaccurate relative location of the parts, and/or inaccurate surface measurements. In particular, this method relies on a high global accuracy of measurement and assembly, a feat that is challenging with large part joining like joining the wing to the fuselage.

SUMMARY

Aircraft wing-to-body join systems and methods are disclosed. In one embodiment, methods include measuring a wing root of an aircraft wing with a photogrammetry sensor; measuring a 3D surface contour of at least one wing root interface surface of the wing root; combining the 3D surface contours of the at least one wing root interface surface to form a complete wing root 3D surface profile of the at least one wing root interface surface; measuring a wing stub of an aircraft body assembly with the photogrammetry sensor; measuring a 3D surface contour of at least one wing stub interface surface of the wing stub by scanning a series of wing stub inspection regions of the at least one wing stub interface surface with the photogrammetry sensor; combining the 3D surface contours of the at least one wing stub interface surface to form a complete wing stub 3D surface profile of the at least one wing stub interface surface; calculating a virtual fit between the aircraft wing and the aircraft body assembly that defines one or more gaps between the at least one wing root interface surface and the at least one wing stub interface surface; and aligning the aircraft wing to the aircraft body assembly to achieve a real fit consistent with the virtual fit.

DESCRIPTION

Figure 1:
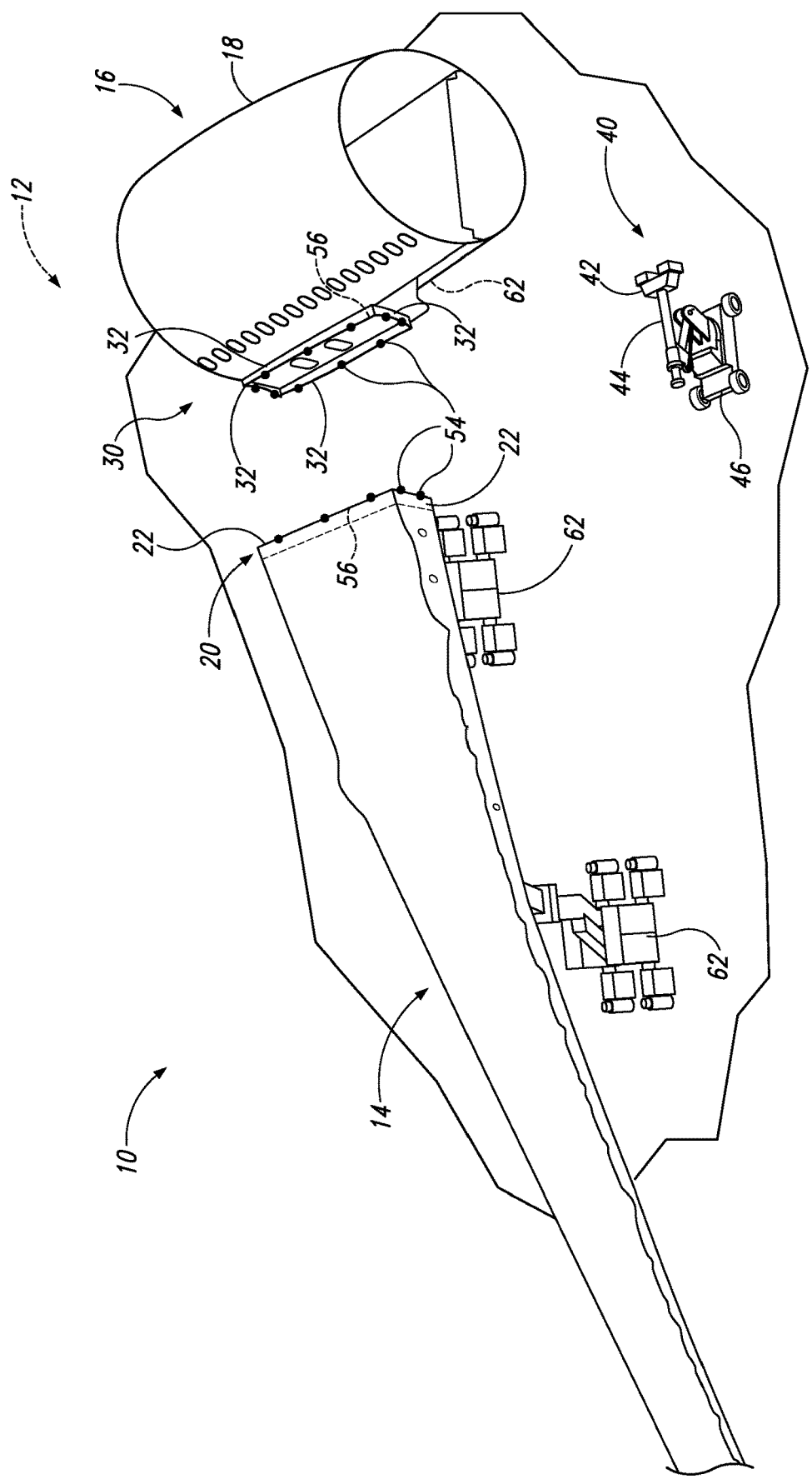
FIG. 1 illustrates an example of a wing-to-body join system.

Wing-to-body join systems and methods according to the present disclosure permit quicker and more certain assembly of the wing to the body of an aircraft and assembly of other large structures. Methods include measuring the 3D (three-dimensional) location of optical targets at the interfaces to be joined (e.g., the wing root and wing stub of an aircraft) and generating a 3D surface profile of each of the interfaces by combining scans of individual inspection regions of the interfaces. The measurement of the individual inspection regions results in 3D surface contours of the regions. The surface contours of the individual inspection regions are combined according to the positions of targets within the regions and the measured 3D locations of the targets.

The 3D surface profiles generated from the individual surface contours (one profile for each of the interfaces to be joined) are used to calculate a virtual fit between the interfaces to be joined. The virtual fit may define gaps between the interfaces that may be filled by shims. Shims may be formed based on the dimensions of the gaps defined in the virtual fit and may be installed in the gaps formed by the real interfaces during the assembly of the structures.

The structures to be joined at their interfaces are aligned to achieve a real fit consistent with the calculated virtual fit using feedback from at least three position sensors positioned within one or both of the interfaces. The position sensors each are arranged to observe distinct alignment pairs of reference features on the interfaces. Each alignment pair includes one reference feature on each of the interfaces. The relative position of the interfaces of the structures obtained with the position sensors is used to adjust the alignment of the structures in a feedback loop until a satisfactory real fit is achieved.

Though examples in this disclosure may refer to aircraft and/or aircraft components, the systems and methods of this disclosure may be utilized with other structures and other components. For example, systems and methods of the present disclosure may be utilized with vehicles, machinery, and large structures. The systems and methods may be associated with automotive assembly, ship building, spacecraft assembly, and/or building construction.

FIGS. 1-9 illustrate wing-to-body join systems and methods. In general, in the drawings, illustrated elements are examples related to the given embodiment. Not all illustrated elements are essential to all embodiments of the present disclosure. An element shown in a figure may be omitted from a particular embodiment without departing from the scope of the present disclosure. Elements that serve a similar, or at least substantially similar, purpose are labelled with numbers consistent among the figures. Like numbers in each of the figures, and the corresponding elements, may not be discussed in detail herein with reference to each of the figures. Similarly, all elements may not be labelled or shown in each of the figures, but reference numerals associated therewith may be used for consistency. Elements, components, and/or features that are discussed with reference to one or more of the figures may be included in and/or used with any of the figures without departing from the scope of the present disclosure.

FIG. 1 is a representation of a wing-to-body join system 10 for an aircraft 12. The system 10 is configured to align and to assemble a wing 14 to a body 16 (e.g., to a fuselage section 18 of the body 16) of the aircraft 12. The wing 14 mates to the body 16 at a wing root 20 (of the wing 14) and a wing stub 30 (of the body 16). The wing root 20 and the wing stub 30 are the wing joint interfaces of the wing 14 and the body 16, respectively. The wing root 20 and the wing stub 30 may have relatively large cross sectional areas (as measured in a hypothetical plane that separates the joint). The wing root 20 and the wing stub 30 may have substantially the same cross sectional area and each independently may have a cross sectional area of greater than 2 m$^2$ (square meters), greater than 10 m$^2$, greater than 20 m$^2$, less than 100 m$^2$, and/or less than 20 m$^2$.

Each of the wing root 20 and the wing stub 30 have interface structures such as flanges, panels, fittings, frames, spars, ridges, grooves, pins, holes, etc. that are configured to mate together. The interface structures mate with the corresponding structures of the opposite wing root 20 or wing stub 30. The surfaces that mate together are wing root interface surfaces 22 (of the wing root 20) and wing stub interface surfaces 32 (of the wing stub 30). Generally, the wing 14 fits to the body 16 like a plug and socket, with interface surfaces on both of the wing root 20 and the wing stub 30 facing various directions (e.g., up, down, fore, aft, inboard, and/or outboard). For example, the interface surfaces of an interface plate extending from the wing root 20 may include an upward-facing surface and a downward-facing surface. The mating structures of the wing stub 30 may include corresponding downward-facing surfaces and upward-facing surfaces. Mating interface surfaces do not necessarily contact each other when mated. Interface surfaces may define a gap when mated. Generally, the wing root interface surfaces 22 and the wing stub interface surfaces 32 are configured to mate in a high-precision alignment. Hence, any contact, if present, may be a close fit (e.g., an interference fit or a slip fit) and any gap, if present, may be small (e.g., a span of less than 5 mm (millimeters), less than 1 mm, less than 0.2 mm, or less than 0.1 mm). As discussed herein, gaps, in particular gaps with a span greater than a predefined threshold thickness, may be filled by shims.

Though the examples herein focus on joining the wing to the body of an aircraft, systems and methods of the present disclosure are applicable to the alignment and assembly of other large and/or complex components such as, for aircraft, joining tail planes to a tail assembly and/or fuselage, and joining fuselage sections together. Therefore, references to wings and aircraft bodies may be substituted with references to a first mating structure (or part assembly) and a second mating structure (or part assembly). The mating structures have interfaces (corresponding to the wing root 20 and the wing stub 30) and interface surfaces at the interfaces (corresponding to the wing root interface surfaces 22 and the wing stub interface surfaces 32). The systems and methods of the present disclosure may be applied to the mating structures to join the interfaces together in a precise alignment of the respective interface surfaces.

During alignment and assembly, the wing 14 and/or the body 16 (e.g., the fuselage section 18 as illustrated in FIG. 1), may be supported and/or positioned by one or more mobile positioners 62. For example, in FIG. 1, the wing 14 is supported by three mobile positioners 62 configured to move the wing 14 to and from the body 16. Mobile positioners 62 are configured to manipulate the position (i.e., orientation and/or location) of the supported wing 14 and/or body 16. Mobile positioners 62 also are configured to move by their own motive force relative to the underlying floor or support surface (together referred to as the factory floor). Thus, mobile positioners 62 may be self-propelled and/or may be described as vehicles. Though mobile positioners 62 may include a motor or actuator to drive wheels, treads, or other locomotion devices, mobile positioners 62 may be supplied power from external sources via, for example, electricity, hydraulic lines, and/or pneumatic lines. One of the wing 14 and the body 16 may be supported by static, or non-mobile, supports. The static supports may be configured to support the respective structure (and optionally to manipulate the position of the respective structure) but not to move by their own motive force across the underlying factory floor.

For a supported structure (e.g., the wing 14 or the body 16), coordinated linear motion of the mobile positioners 62 across the underlying factory floor may be used to translate and/or rotate the support structure in the plane of the factory floor. Mobile positioners 62 may include jacks, actuators, or other lift devices to adjust the height (up or down) and/or inclination of the supported structure. Thus, mobile positioners 62 are adapted to move and/or to position the supported structure in three dimensions, generally by translation and rotation.

Mobile positioners 62 include an electronic controller and may be referred to as robotic and/or computer controlled mobile positioners. Mobile positioners 62 may be ultimately operated by a human operator (e.g., with a remote control) and/or may operate autonomously and/or semi-autonomously (e.g., following the alignment and positioning methods described herein).

Wing-to-body join systems 10 include a scanning platform 40 that includes at least one scanning head 42. The scanning platform 40 is configured to measure the 3D locations of targets 54 on the wing root 20 and the wing stub 30. The scanning platform 40 also is configured to measure the surface contours of the interface surfaces of the wing root 20 and the wing stub 30 (e.g., the wing root interface surface 22 and the wing stub interface surface 32). The scanning head 42 is configured to measure the locations and/or the surface contours in 3D and in a non-contact manner. For example, the scanning head 42 may be configured to measure by photogrammetry, stereo-imaging, laser profilometry, optical interference techniques, and/or by optical time-of-flight techniques.

Scanning platforms 40 may include one scanning head 42 configured for one measurement technique and a different scanning head 42 configured for another measurement technique. Additionally or alternatively, scanning platforms 40 may include a scanning head 42 configured for several measurement techniques. Scanning heads 42 may be configured to measure by optical techniques. Optical techniques may include measuring light and/or illuminating with light. As used herein, light may include ultraviolet light, visible light, and/or infrared light. Scanning heads 42 may include one or more optical sensors (e.g., digital cameras, photodiodes, and/or photomultiplier tubes) and may include one or more illuminators (e.g., light projectors, lasers, lamps, and/or light emitting diodes). The optical sensors and illuminators of a scanning head 42 are configured to measure (e.g., observe) and/or to illuminate a defined region which may be referred to as a measurement region, an observation region, an assessment region, or an inspection region, as discussed further herein.

The scanning platform 40 may include an arm 44 and a carriage 46. The arm 44 may be an articulated arm (also called a robotic arm) that is configured to move and/or to position the scanning head 42. For example, the arm 44 may be configured to move the scanning head 42 to measure and/or to observe the respective object (e.g., the wing root 20, the wing stub 30, and/or the respective interface surfaces) from different angles and/or different locations. The arm 44 is coupled to the scanning head 42 and to the carriage 46. The arm 44 is configured for relative movement between the scanning head 42 and the carriage 46. The arm 44 may be configured to move the scanning head 42 in one or more of the three orthogonal dimensions and/or may be configured to rotate the scanning head 42 about one or more axes.

For example, the scanning platform 40 may be configured to move the scanning head 42 in three orthogonal directions and to rotate the scanning head 42 about the three orthogonal directions. The arm 44 may include actuators, motors, and similar devices configured to achieve this range of motion.

The carriage 46 is coupled to the arm 44 and, via the arm 44, to the scanning head 42. The carriage 46 may be mobile in that the carriage 46 may be configured to travel along the factory floor. The carriage 46 may include and/or may be coupled to a motor or other power source to provide energy for locomotion. The carriage 46 may include wheels, treads, or other locomotive mechanisms. The scanning platform 40 may be configured to move by rolling, creeping, walking, levitating (e.g., by air bearing and/or by magnetic levitation). The scanning platform 40 may be strung by cables, attached to a gantry, etc. to effect motion of the scanning platform 40 and/or the scanning head 42.

In embodiments where the scanning platform 40 is mobile, the scanning platform 40 may be referred to as a mobile scanning platform and/or a scanning vehicle. In some embodiments, the scanning platform 40 may be guided, automatic, autonomous, and/or semi-autonomous, meaning that a user may guide the vehicle via direct control and/or programming. The scanning platform 40 may be configured and/or programmed to navigate the factory floor, avoid obstacles, accelerate, decelerate, and/or reposition itself with little to no operator intervention, e.g., by supplying a move path or destination coordinates.

The scanning platform 40 may be configured and/or programmed to move along a defined path and/or an arbitrary path on the factory floor. The scanning platform 40 may be configured and/or programmed to move between measurement sites, and/or the scanning platform 40 may be configured and/or programmed to make measurements at different measurement sites. The scanning platform 40 and/or the scanning head 42 may be configured and/or programmed to measure the wing root 20, the wing stub 30, and/or the respective interface surfaces at any location at the measurement site and/or in any orientation. For example, the scanning platform 40 may be configured to travel to a location at a measurement site and to position the scanning head 42 into a position that faces the interface surface to be measured.

The scanning platform 40 may be configured to determine its own position (i.e., location and/or orientation) and/or the position of the scanning head 42. Thus, the scanning platform 40 may be configured to provide relative position measurements in a common coordinate system even when the scanning platform 40 moves the scanning head 42 and/or the scanning platform 40 as a whole. Additionally or alternatively, the scanning platform 40 and/or the scanning head 42 may be configured to measure in a common coordinate system the wing root 20 (and/or its interface surfaces) at a wing measurement site and the wing stub 30 (and/or its interface surfaces) at a body measurement site.

Figure 2:
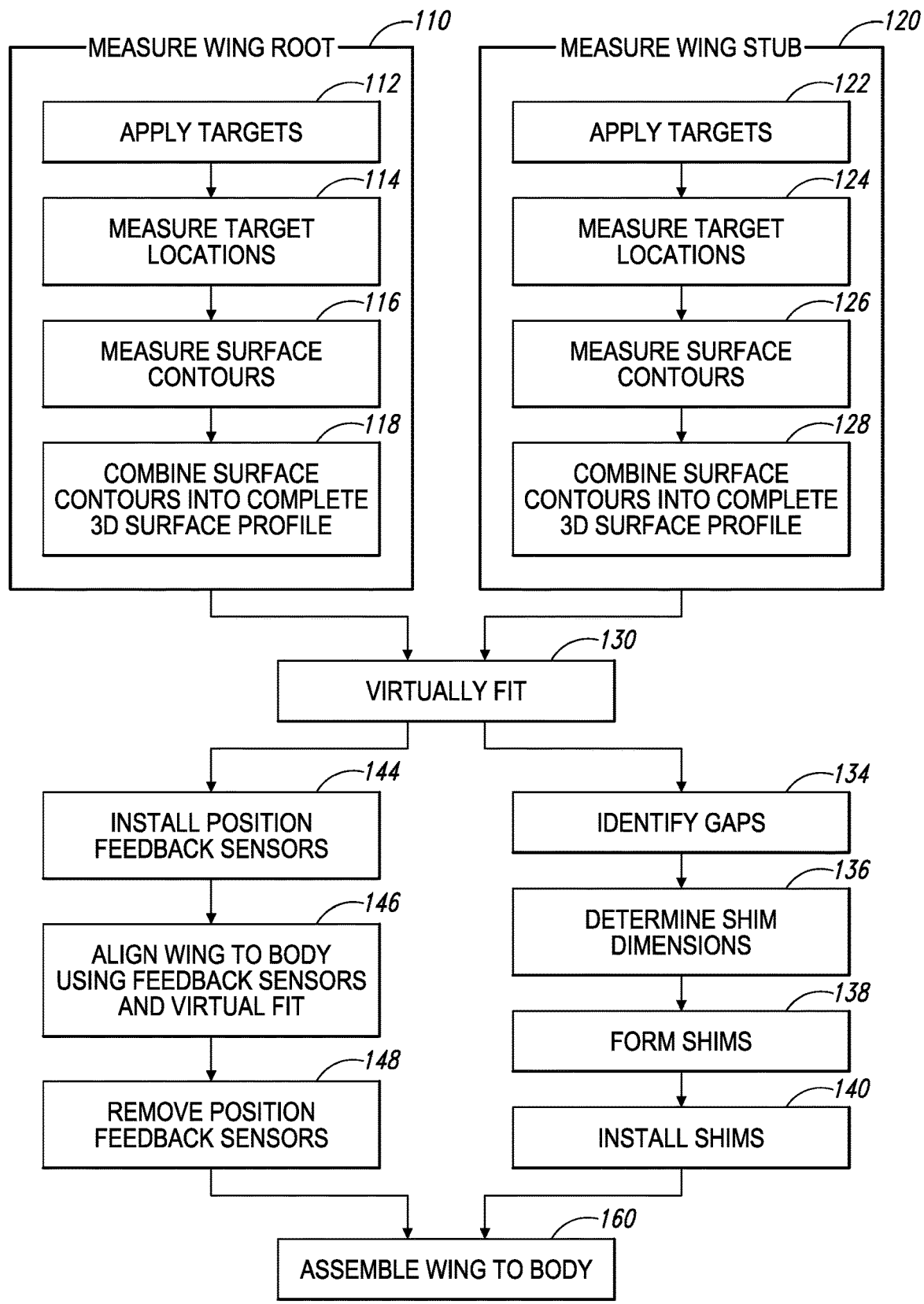
FIG. 2 is a schematic representation of wing-to-body join methods according to the present disclosure.

FIG. 2 represents methods 100 according to the present disclosure. Methods 100 generally include joining the wing of an aircraft to the body of the aircraft by measuring 110 the wing root, measuring 120 the wing stub, virtually fitting 130 the wing root and the wing stub (also referred to as calculating a virtual fit), and aligning 146 the wing to the body according to the calculated virtual fit using feedback from one or more position sensors (also called position feedback sensors) embedded in the interface between the wing and body.

The measurement of the wing root and the wing stub may be used to identify 134 gaps between the wing root and the wing stub, and to determine 136 shim dimensions to substantially fill the gaps. Further, methods 100 may include forming 138 shims according to the determined shim dimensions and/or may include installing 140 shims in the corresponding real gaps that are formed by a real fit according to the calculated virtual fit.

Methods 100 may include a measurement process that includes applying targets (e.g., targets 54), measuring the 3D locations of those targets, and generating 3D surface profiles of the wing root and wing stub interface surfaces by combining scans of a series of wing root inspection regions within the wing root interface surfaces and combining scans of a series of wing stub inspection regions within the wing stub interface surfaces. Each wing root inspection region and each wing stub inspection region includes at least two of the targets. For example, measuring 110 the wing root may include applying 112 targets to the wing root (e.g., on and/or near the wing root interface surfaces), measuring 114 the target locations (in 3D), measuring 116 the individual 3D surface contours of the wing root interface surfaces within a series of wing root inspection regions that each include at least two of the targets, and combining 118 the individual 3D surface contours into a complete 3D surface profile of the wing root interface surfaces. The analogous measuring 120 of the wing stub may include applying 122, measuring 124, measuring 126, and combining 128, which are analogous to the respective applying 112, measuring 114, measuring 116, and combining 118 except applicable to the wing stub rather than the wing root.

Applying 112 and applying 122 may include applying targets to the respective wing root or wing stub (e.g., respectively applying wing scan targets to the wing root and applying body scan targets to the wing stub). As indicated in the detail of the wing root and wing stub interfaces of FIG. 3, the targets 54 may be applied on and/or near the wing root interface surfaces 22 of the wing root 20 and the wing stub interface surfaces 32 of the wing stub 30. For example, the targets 54 may be located on and/or applied to one or more target fences 56 that are affixed to the respective wing joint interface (the wing root 20 or wing stub 30). Additionally or alternatively, the targets 54 may be applied to the respective wing root interface surfaces 22 or wing stub interface surfaces 32, and/or to surfaces of the respective wing root 20 or wing stub 30 that are not interface surfaces (i.e., surfaces that do not form the interface between the wing root 20 and the wing stub 30). Targets 54 generally are applied to avoid obscuring the respective wing root interface surfaces 22 and wing stub interface surfaces 32 (e.g., by spacing the targets apart from the surfaces). Hence, the location of the targets 54 may facilitate measurement of the surface profiles of the respective surface interfaces.

The targets 54 generally are dispersed about the wing root and wing stub interfaces. Dispersing the targets 54 about the corresponding interface may provide for more measurement position options (e.g., more positions in which a threshold number of targets 54 are visible) and/or better 3D measurements than may be obtained if the targets 54 are clustered.

The applying 112 and applying 122 may include placing the targets 54 in precise locations and/or predetermined locations but do not require precise placement or specific location of the targets 54. Groups of targets 54 may be applied to the wing root 20 or the wing stub 30 with known relative positions (e.g., by using a target fence 56 as discussed further herein). The group of targets 54 at or on one of the wing joint interfaces may be referred to as a constellation of targets 54.

Targets 54 generally are optically distinct objects and may include (and/or may be) a reflector, a retroreflector, a symbol, and/or a marking that is optically distinct (e.g., that stands apart from the nearby optical background). Targets 54 may include reflective materials, absorptive materials, fluorescent materials, and/or luminescent materials. Targets 54 may be referred to as retroreflective targets, reflective targets, coded targets (e.g., including barcodes, 2D (two dimensional) barcodes, alphanumeric characters, and/or other symbols), fluorescent targets, and/or luminescent targets. Targets 54 may be adapted for photogrammetry, laser tracking, or other optical techniques. For example, targets 54 may respond to illumination light and/or ambient light (e.g., by reflecting, absorbing, scattering, and/or fluorescing). Targets 54 also may be referred to as optical targets, photogrammetry targets, and/or laser targets.

Figure 3:
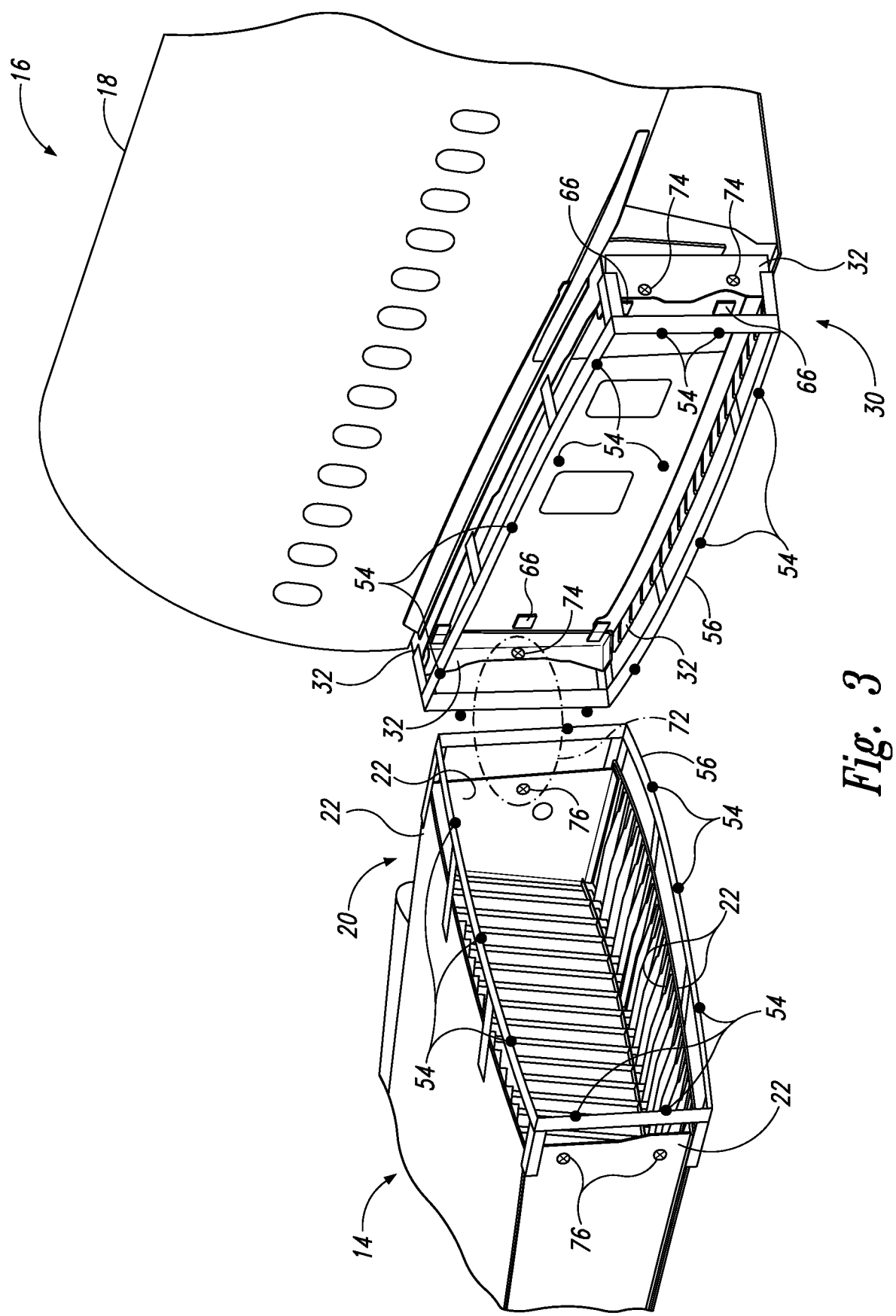
FIG. 3 illustrates a wing root and a wing stub, indicating examples of component locations.

Targets 54 may be applied by directly or indirectly affixing (e.g., coupling, bonding, and/or fastening) the targets 54 to the respective wing root 20 or wing stub 30. One or more targets 54 may be affixed to a target fence 56 (which also may be referred to as a target support and/or a target frame). The target fence 56 may be affixed to the respective wing root 20 or wing stub 30. Target fences 56 may provide stable and/or secure support for the attached targets 54, and/or may be coupled to the respective wing root 20 or wing stub 30 at points spaced apart from the interface surfaces. Target fences 56 may support a plurality of targets 54 in defined relative positions and/or facilitate reuse of the targets 54 in the defined relative positions. Though FIG. 3 shows a single target fence 56 on the wing root 20 and a single target fence 56 on the wing stub 30, targets 54 may be applied without a target fence 56. A plurality of target fences 56 may be utilized with one or both of the wing joint interfaces. Target fences 56 may include one or more bars, posts, rails, tubes, plates, sheets, and/or wires upon which the targets 54 may be supported.

Use of target fences 56 may facilitate application and/or removal of the targets 54 to and/or from the respective wing root 20 or wing stub 30. For example, the target fences 56 may facilitate applying many targets 54 at once (many targets on one target fence 56) and/or may facilitate temporary installation of the targets 54 (e.g., the target fence 56 is temporarily affixed to the respective wing root 20 or wing stub 30 with fasteners and the targets 54 are affixed to the target fence 56 by adhesive). Thus, a target fence 56 may be used to perform quick installation and/or removal of a group of targets 54 (as compared to individual placement of the targets 54).

Targets 54 may be applied at a density to facilitate measuring the surface profiles of the respective interface surfaces at a series of inspection regions. Generally, targets 54 are applied such that at least one target 54 would be observed (e.g., imaged) in each of the inspection regions (as described further herein with respect to FIGS. 4 and 5). For example, the targets 54 may be applied to the respective wing root 20 and wing stub 30 at a density of between 1 and 20 targets per square meter. With respect to the application of the targets 54, the density of application is the number of targets 54 applied to a wing root 20 or wing stub 30 divided by the cross sectional area of the respective wing root 20 or wing stub 30. The targets 54 are not necessarily in a plane or a plane that separates the wing joint and delimits the cross sectional area.

Targets 54 may be arranged such that the targets 54 are observable (e.g., by the scanning platform 40) simultaneously with the neighboring interface surfaces. Targets 54 may be arranged such that the targets are observable with more than one interface surface and/or more than one inspection region of an interface surface. For example, a flange-type interface structure may have interface surfaces that face substantially opposite directions (e.g., up and down). A target 54 may be placed near the interface structure (e.g., spaced apart from the surface with a target fence 56) such that the target 54 is observable from the opposite directions (e.g., the bottom and the top). For example, the target may be double-sided or spherical.

Measuring the target locations (e.g., measuring 114 and measuring 124 the targets 54 on the respective wing root 20 and wing stub 30) includes determining the 3D location of each target 54 measured. The locations may be relative locations and/or locations relative to a common coordinate system. For example, measuring 114 and measuring 124 may include measuring the corresponding targets 54 relative to each other (at least relative to one or more targets 54 on the same wing root 20 or wing stub 30). Measuring 114 and measuring 124 may include measuring the targets 54 in a common coordinate system (e.g., a common coordinate system for all targets 54 applied to one or both of the wing root 20 and wing stub 30). Use of a common coordinate system may facilitate determining the relative locations of the targets 54 (e.g., the targets 54 of one or both of the wing root 20 and wing stub 30).

Figure 4:
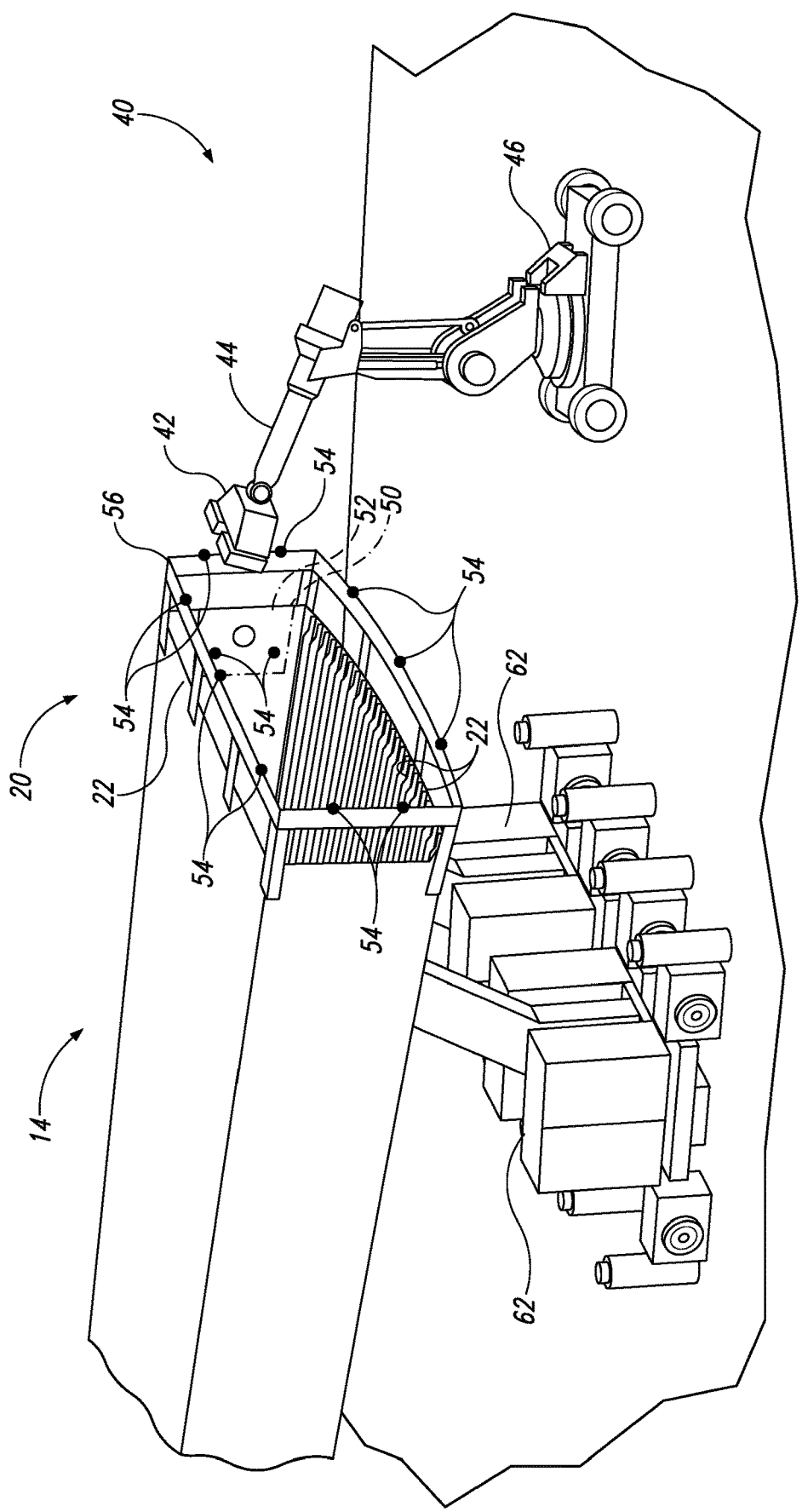
FIG. 4 illustrates a scanning platform scanning a wing root.
Figure 5:
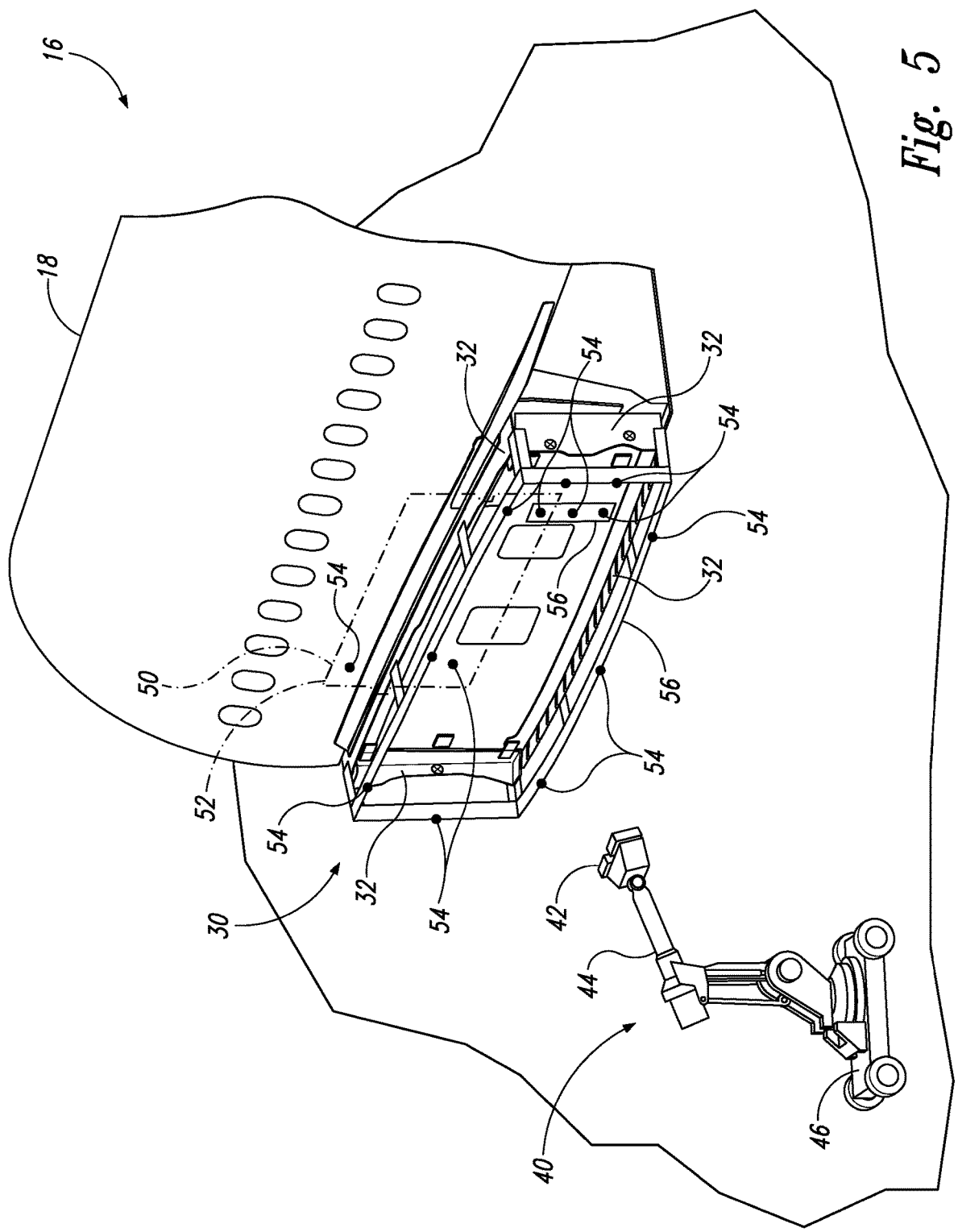
FIG. 5 illustrates a scanning platform scanning a wing stub.

As represented by FIGS. 4 and 5, measuring the target locations is a non-contact procedure and may be by machine vision, 3D optical scanning, photogrammetry, and/or structured light imaging to determine the 3D locations of the targets 54. The 3D locations of the targets 54 may be determined by measuring the target locations with the scanning platform 40. Machine vision is a technique that uses electronic imaging and algorithms to extract geometric information from one or more images of the object under study (e.g., the targets 54 associated with the respective wing root 20 (FIG. 4) or wing stub 30 (FIG. 5)). 3D optical scanning (which includes techniques such as laser tracking, LIDAR, and laser range finding) is a technique which uses light reflection, often from a laser, to calculate the surface geometry of the object under study. Typically, the surface geometry is calculated from the time-of-flight or from triangulation. Photogrammetry is a technique that determines the surface geometry of the object under study through analysis of electronic images, commonly multiple images from different perspectives (angles). Photogrammetry may use multiple cameras to obtain the images from different perspectives. Structured light imaging is a technique that projects a pattern of light onto the object under study and calculates the surface geometry from detected distortions of the pattern reflected by the surface of the object under study.

Measuring the target locations (e.g., measuring 114 and measuring 124) may include imaging a group of one or more assessment regions 50 on the respective wing root 20 or wing stub 30. The group of assessment regions 50 is configured to include all or substantially all of the targets 54 of the respective wing root 20 or wing stub 30. Hence, the group of assessment regions 50 may form a mosaic and/or a patchwork that at least substantially covers the entirety of the interface surfaces of the respective wing root 20 or wing stub 30. The assessment regions 50 may overlap in that at least one portion of an interface surface may be covered by more than one assessment region 50. Additionally or alternatively, at least one target 54 may be within at least two assessment regions 50 (such a target 54 may be referred to as a shared target). Each assessment region 50 may include a plurality of targets 54, e.g., including 2, 3, 4, 5, 6, or more than 6 targets 54. The scanning platform 40 may be directed to move the scanning head 42 to observe each of the assessment regions 50 on the respective wing root 20 or wing stub 30.

Measuring 110 the wing root 20 may include moving the scanning platform 40 and/or the wing 14 to a wing measurement site, and may include measuring the wing root 20 at the wing measurement site. Likewise, measuring 120 the wing stub 30 may include moving the scanning platform 40 and/or the body 16 to a body measurement site, and may include measuring the wing stub 30 at the body measurement site. The wing measurement site and the body measurement site may be in the same facility (e.g., on the same factory floor) or may be in different geographic locations. Measuring 110 and measuring 120, and steps of methods 100 generally, may be performed at the same or different geographic locations. Performing one or more steps at the same geographic location, such as on the same factory floor, may facilitate accurate measurement and assembly of the wing root 20 and the wing stub 30. For example, measuring 110 and measuring 120 may be performed at the same assembly site (e.g., the assembly site includes the wing measurement site and the body measurement site) while the wing 14 and the body 16 are acclimated to the same environment. As another example, measuring 110 may be performed 'in place' as the wing 14 is held by mobile positioners 62 that will be used to move the wing 14 to the body 16.

Methods 100 may include measuring an individual 3D surface contour of each of the interface surfaces of the wing root and wing stub. For example, methods 100 may include measuring 116 an individual 3D surface contour of each of the wing root interface surfaces 22 and may include measuring 126 an individual 3D surface contour of each of the wing stub interface surfaces 32. A 3D surface contour is a digital representation of the physical surface geometry of the interface surface. The 3D surface contour may be in the form of a point cloud, a polygonal mesh, and/or a tessellation.

Measuring the individual 3D surface contours of each of the interface surfaces is performed with non-contact methods, typically optical methods. For example, measuring 116 and measuring 126 may be by machine vision, 3D optical scanning, photogrammetry, and/or structured light imaging to determine the 3D surface contours. Measuring 116 and measuring 126 may include measuring with the scanning platform 40.

Generally, measuring the individual 3D surface contours includes measuring the surface interfaces with high-resolution (e.g., with lateral resolution and a depth resolution each independently less than 1 mm or less than 0.1 mm). For example, a digital camera may be used to image an inspection region 52 of the interface surfaces. The digital camera may be arranged to resolve surface features less than 1 mm or less 0.1 mm apart.

For photogrammetry and/or structured illumination methods, measuring the 3D surface contours may include illuminating an inspection region 52 with an array of projected features. The projected features are optical features (such as spots, lines, polygons) projected onto the corresponding interface surface. The array may be a regular or irregular array. The projected features and/or the arrangement of the projected features are distorted by the interface surface and are used to determine the 3D surface contour. The density of the projected features affects the lateral and depth resolution of the resulting measurement of the interface surface. Measuring the 3D surface contours may include illuminating the inspection region 52 with an array of projected features at a density of greater than 100, greater than 1,000, or greater than 10,000 projected features per square meter of the inspection region 52. As used herein, the density of projected features is the number of projected features in an inspection region 52 divided by the cross sectional area of the respective wing root 20 or wing stub 30 encompassed by the inspection region 52.

Measuring the individual 3D surface contours of each of the interface surfaces may include scanning a series of inspection regions 52 of the interface surfaces. Each inspection region 52 includes a portion of the interface surfaces of the respective wing root 20 or wing stub 30. The series of inspection regions 52 for the respective wing root 20 or wing stub 30 encompasses all of the interface surfaces of the respective wing root 20 or wing stub 30. Each inspection region 52 may be substantially the same size (encompassing substantially the same cross sectional area of the inspected wing joint interface) and may be substantially the same as the assessment regions 50 that are used to determine the 3D locations of the targets 54.

Each of the inspection regions 52 is configured to include at least two targets 54 (e.g., 2, 3, 4, 5, 6, or more than 6 targets 54). Measuring the 3D surface contours includes measuring the location of the targets 54 in an inspection region 52 relative to the surface contour. As discussed herein, the targets 54 generally are arranged to permit optical access to the interface surfaces so that the entirety of the interface surfaces may be measured while the targets 54 are present.

The inspection regions 52 and/or the targets 54 may be arranged and/or selected such that each inspection region 52 encompasses a unique and/or distinct group of targets 54. If an inspection region 52 encompasses a distinct group of targets 54, the distinct grouping of targets 54 may be used to identify the location of the inspection region 52 within the corresponding wing root 20 or wing stub 30. Measuring the 3D surface contours may include positioning the scanning platform 40 and/or the scanning head 42 to observe a particular inspection region 52 at least partially defined by the 3D locations of a group of (one or more) specific and/or distinct targets 54.

Methods 100 include generating a complete 3D surface profile of all of the interface surfaces, for each of the wing root 20 and the wing stub 30, e.g. by combining 118 and combining 128 the individual 3D surface contours into respective complete 3D surface profiles of all of the interface surfaces of the respective wing root 20 and wing stub 30. Generating the complete 3D surface profiles includes combining the series of scans of the inspection regions 52 based upon the measured 3D locations of the targets 54 and the relative locations of the targets 54 within the individual inspection regions 52. The measured 3D locations of the targets 54 may be used to position (locate and orient) the measured 3D surface contours of each of the inspection regions 52. The combined 3D surface contours positioned according to the targets 54 within the individual inspection regions 52 are the complete 3D surface profile of the corresponding wing root 20 or wing stub 30. The complete 3D surface profile of the wing root 20 (a digital representation of the measured wing root interface surfaces 22) may be referred to as the wing root 3D surface profile. Similarly, the complete 3D surface profile of the wing stub 30 (a digital representation of the measured wing stub interface surfaces 32) may be referred to as the wing stub 3D surface profile. The 3D surface profiles of the wing root 20 and the wing stub 30, each independently, may include (and/or may be) a point cloud, a polygonal mesh, and/or a tessellation. The 3D surface profiles may include discontinuities where there is no corresponding interface surface of the respective wing root 20 or wing stub 30.

Methods 100 include virtually fitting 130 the wing root 20 to the wing stub 30. The virtual fit is based on the measured, 3D surface profiles (and/or one or more of the individual 3D surface contours) of the wing root 20 and the wing stub 30. The 3D surface profiles are arranged to form a virtual fit which is consistent with mating the measured interface surfaces (e.g., no interference). Virtual fitting 130 may include importing the 3D surface profiles into a 3D model manipulation program, such as a CAD program (computer aided design program), and optimizing the relative positions of the 3D surface profiles until the desired fit is achieved. Virtual fitting 130 may include identifying features within the 3D surface profiles and aligning those features according to engineering and/or aerodynamic considerations.

When virtually fit together, the wing root to wing stub interface may define one or more gaps. The gaps may be by design (e.g., to accommodate adjustment for the proper aerodynamics and/or for manufacturing tolerance stack-up). Methods 100 may include identifying 134 one or more gaps between the wing root 20 and the wing stub 30 in the virtual fit (between one of the wing root interface surfaces 22 and one of the wing stub interface surfaces 32). Identifying 134 gaps may include determining the dimensions of the gaps, e.g., from the 3D surface profiles and the relative positions of the wing root 20 and the wing stub 30. Further, identifying 134 gaps may include identifying any gaps which span a distance between the wing root 20 and the wing stub 30 of greater than a predefined threshold (e.g., 1 mm or 0.1 mm).

Methods 100 may include determining 136 shim dimensions to fit one or more of the gaps, e.g., gaps that span a distance greater than the predefined threshold. Shim dimensions may be determined by the span of the gap and the 3D surface profiles of the wing root 20 and the wing stub 30. The shim dimensions may be the same as space defined by the span and 3D surface profiles in the virtual fit and/or may be undersized by a small tolerance (e.g., undersized in the span direction). The small tolerance may be less than or equal to 0.5 mm, 0.1 mm, 0.05 mm, or 0.02 mm. Determining 136 the shim dimensions does not require a preliminary fit of the wing root 20 to the wing stub 30 or measurements of real gaps with feeler gauges or otherwise.

Figure 6:
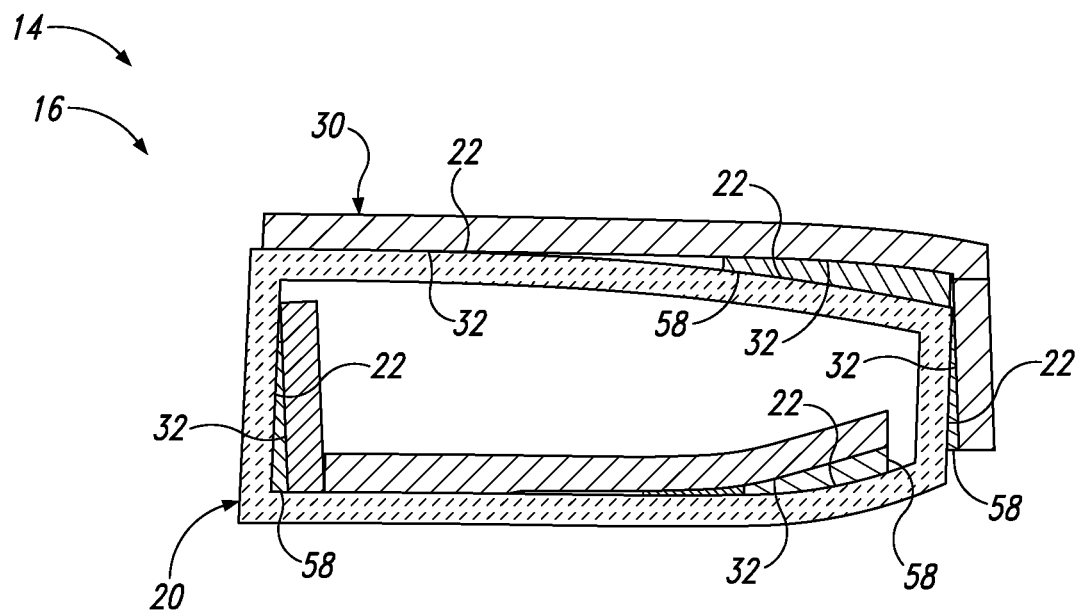
FIG. 6 schematically represents a cross section of a wing root and a wing stub joined with shims.

FIG. 6 illustrates shims 58 fit between wing root interface surfaces 22 and wing stub interface surfaces 32. FIG. 6 shows, in cross section, the wing root 20 and wing stub 30 fit together with gaps between the interface surfaces of the wing root 20 and wing stub 30. The relative alignment of the wing 14 and the body 16 may affect the presence, location, and/or size of the gaps. In FIG. 6, shims 58 are present in some of the gaps, substantially filling the gaps between the wing root interface surfaces 22 and the wing stub interface surfaces 32. Shims 58 may fix the alignment of the wing 14 and the body 16, and/or may increase the structural integrity of the wing joint.

Shims 58 may be substantially prismatic with a thickness corresponding to the span of the gap. Shims 58 may be contoured to fit the gap, substantially conforming to the local interface surfaces. The thickness of a shim 58 (and the span of a gap) may not be uniform and may vary across a dimension perpendicular to the thickness (and span). Hence, gaps and shims 58 may be wedge-shaped, sheet-like, and/or parallelepiped-shaped.

As represented in FIG. 2, methods 100 may include forming 138 shims 58 according to the shim dimensions and/or gap sizes. Shims 58 may be formed by machining, pressing, stamping, cutting, and/or additive manufacturing techniques. For example, shim dimensions determined by determining 136 may be supplied to a machinist to form the shim 58 and/or to an automated, numerically-controlled machining center. Because the shim dimensions may be determined by the virtual fit, the shims 58 may be formed before the wing root 20 and the wing stub 30 are ever brought together and may be formed while the wing 14 and the body 16 remain separated. Further, methods 100 may include installing 140 the formed shims 58 between the wing root 20 and the wing stub 30 when the wing 14 and body 16 are brought together to create the real fit (as shown in FIG. 6).

Figure 7:
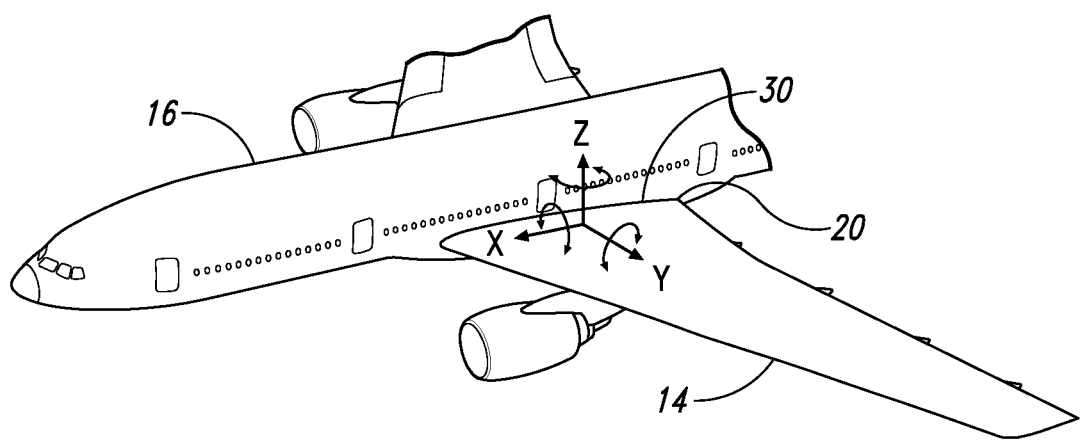
FIG. 7 is a representation of a wing assembled on a body indicating relative positioning directions.

Virtually fitting 130 additionally may be based in part on aerodynamic considerations, i.e., the virtual fit may orient the wing 14 in the designed manner (consistent with the engineering design and/or within engineering tolerance) with respect to the body 16. As shown in FIG. 7, the wing orientation may include the wing pitch (rotation about the y-axis), the wing rake (rotation about the z-axis), and the wing dihedral angle (rotation about the x-axis).

Returning to the methods 100 represented in FIG. 2 and the wing-body interface shown in FIG. 3, methods 100 include aligning 146 the wing 14 to the body 16 using feedback to achieve a real fit consistent with the calculated virtual fit. Methods 100 may include using at least three position sensors 66 to monitor the relative position of the wing 14 and body 16. The position sensors 66 also may be referred to as position feedback sensors 66. The relative position measured by the position sensors 66 may be used to automatically guide the alignment process.

Methods 100 may include installing 144 position sensors 66. Installing 144 may include positioning at least three position sensors 66 each independently within the wing root 20, the wing stub 30, or both (e.g., the position sensor 66 may be within both the wing root 20 and the wing stub 30 when the wing root 20 and the wing stub 30 are almost fully aligned).

Position sensors 66 are configured for non-contact sensing of the relative position of the wing root 20 and the wing stub 30, and generally are non-contact and/or optical sensors. For example, the position sensors 66 may include, and/or may be cameras and/or laser trackers.

Each position sensor 66 is arranged to observe a distinct alignment pair 72 of reference features (74, 76). One of the reference features, designated the first reference feature 74, is a reference feature on the wing root 20 or wing stub 30 (shown on the wing stub 30 in FIG. 3). The other of the reference features, designated the second reference feature 76, is a reference feature on the other wing joint interface, i.e., respectively the wing stub 30 or wing root 20. The second reference feature 76 is shown on the wing root 20 in FIG. 3.

Reference features are features of the respective wing root 20 or wing stub 30 that have a fixed and/or stable position relative to the respective wing root 20 or wing stub 30. For example, a reference feature may be a hole, a slot, a ridge, a groove, a pin, a window, a mark, and a target (e.g., a reflector, a reticule, etc.). Methods may include applying at least one of the reference features to the respective wing root 20 or wing stub 30. Reference features may be applied by cutting and/or marking the respective wing root 20 or wing stub 30. Reference features may be applied by affixing a marker and/or a target to the respective wing root 20 or wing stub 30.

Reference features of an alignment pair 72 are configured to align in a manner such that both reference features are observable during at least a portion of alignment. Generally, at least one of the reference features includes a hole, a cutout, and/or a transparent structure through which the other reference feature may be observed. Additionally or alternatively, the corresponding position sensor 66 is arranged such that both of the reference features of the alignment pair 72 are visible at least at some point during alignment of the wing root 20 and the wing stub 30.

Figure 8:
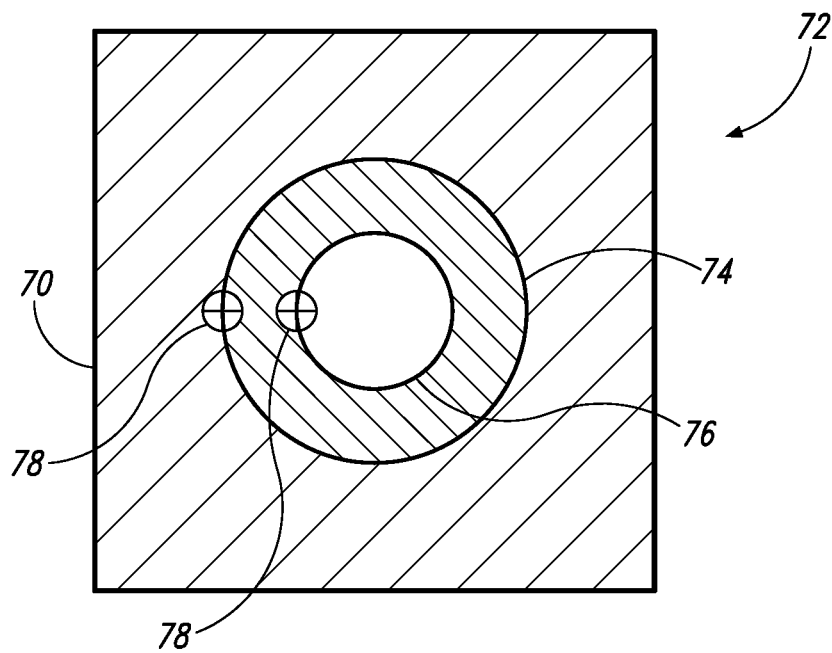
FIG. 8 is an example of an alignment pair of reference features.
Figure 9:
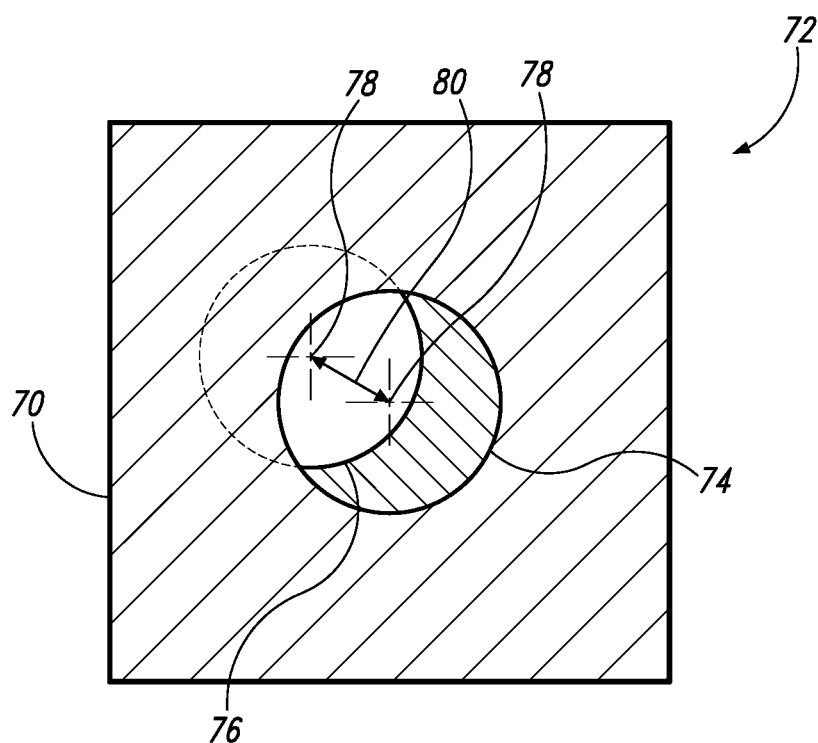
FIG. 9 is another example of an alignment pair of reference features, illustrating a relative distance between reference features.

FIGS. 8 and 9 illustrate different examples of arrangements of alignment pairs 72 of reference features. In the examples of FIGS. 8 and 9, the reference features (74, 76) are holes in a position feedback inspection area 70. Each of the position sensors 66 (not shown in FIGS. 8 and 9) are arranged to observe a different position feedback inspection area 70. The first reference feature 74 has an open center through which the second reference feature 76 may be observed by the corresponding position sensor 66.

During feedback for alignment (i.e., during aligning 146), the position sensors 66 may observe their corresponding alignment pair 72 of reference features. The alignment of the alignment pair 72 may be defined by comparing fiducial points 78 of the two reference features, e.g., the distance 80 between the fiducial points 78. The fiducial points 78 of each reference feature are defined points of the corresponding reference feature. For example, a fiducial point may be the center, the top, the bottom, the left, or the right of an open region. In the example of FIG. 8, the fiducial point 78 of each reference feature is the leftmost point on the circumference of the corresponding hole. In the example of FIG. 9, the fiducial point 78 of each reference feature is the center of the corresponding hole. Though illustrated as similar figures, reference features of an alignment pair 72 do not need to be the same or similar. For example, the first reference feature 74 may be a square window and the second reference feature 76 may be a cross-hair mark visible through the window of the first reference feature 74. Likewise, fiducial points 78 of the two reference features of an alignment pair 72 do not need to be defined the same or similarly. For example, the fiducial point 78 of the prior example square window may be the left edge and the fiducial point 78 of the prior example cross-hair mark may be the center of the mark.

Aligning 146 may include moving at least one of the wing 14 and/or the body 16 with, e.g., mobile positioners 62 (as described with respect to FIG. 1). Aligning 146 may include supporting the wing 14 and/or the body 16 with one or more mobile positioners 62 (e.g., 1, 2, 3, or more than 3 mobile positioners 62 for the wing 14 and/or the body 16). Aligning 146 may include positioning (e.g., locating and/or orienting) the wing 14 and/or the body 16 in three dimensions relative to each other to achieve the real fit consistent with the calculated virtual fit. The moving structure (the wing 14 and/or the body 16) may be positioned in at least three translational directions and/or about at least three rotational axes.

Aligning 146 may include measuring the relative positions (e.g., distances, orientations, angles, and/or other objective measures) between reference features of alignment pairs 72 of reference features with the corresponding position sensors 66. For example, the relative positions between reference features may be the distances 80 between fiducial points 78 of the reference features. Aligning 146 may include repeating in a feedback loop: (i) moving the wing 14 and body 16 together, and (ii) measuring with each position sensor 66 the relative positions between the reference features of the corresponding alignment pair 72 until an error metric related to the relative positions is below a predetermined threshold. The error metric may be the sum of the absolute values of relative positions, the sum of the squares of the relative positions, or other error metrics suitable for alignment optimization. Additionally or alternatively, the relative positions between the reference features may be compared to a residual offset as defined by the virtual fit. For example, the calculated virtual fit may correspond to a residual offset (possibly a residual offset of zero, i.e., no offset) between the reference features of one or more alignment pairs 72. Aligning 146 would then seek to optimize the relative positions between reference features relative to the residual offsets of those reference features.

Aligning 146 may determine the relative positions of the reference features of each alignment pair 72 (as compared to the residual offsets), calculate the error metric, and move the wing 14 and body 16 to reduce the error metric. To facilitate alignment and/or calculation of the movement direction(s) needed to reduce the error metric, the alignment pairs 72 and/or the position sensors 66 may be configured to indicate alignment along substantially orthogonal directions. For example, one of the position sensors 66 and corresponding alignment pair 72 may be configured to indicate displacement in the x-direction (the fore-aft direction). A second position sensor 66 and corresponding alignment pair 72 may be configured to show displacement in the y-direction (the inboard-outboard direction). And, a third position sensor 66 and corresponding alignment pair 72 may be configured to show displacement in the z-direction (the up-down direction). By configuring the position sensors 66 and/or the alignment pairs 72 to indicate displacement in orthogonal directions, the movement determination based on the measured positions of the reference features may be simplified. For example, if only one position sensor 66 indicates relative x-direction movement, the relative distance between the corresponding reference features (as compared to the residual offset) may drive the mobile positioners 62 in the x-direction (e.g., proportionally), without significant concern for the determined relative positions of the reference features of the alignment pairs 72 observed by the other position sensors 66.

Aligning 146 may include conventional feedback techniques and control loops, e.g., proportional feedback, proportional-derivative feedback, and/or proportional-integral-derivative feedback, as is understood by one of skill in the art of control systems.

Aligning 146 may include comparing the positions of the wing 14 and the body 16 to the calculated virtual fit. The positions of the wing 14 and the body 16 may be determined by the measuring of the 3D locations of the targets (e.g., measuring 114 and measuring 124), by the measuring of the 3D surface contours (e.g., measuring 116 and measuring 126), and/or by knowledge of the approximate positions of the wing 14 and body 16 (e.g., by measuring a distance between). Aligning 146 may initially include creating and/or following an alignment path from the initial positions of the wing 14 and body 16 to the desired mating positions of the calculated virtual fit. Aligning 146 may include moving one or both of the wing 14 and the body 16. For example, aligning 146 may include moving the wing 14 with mobile positioners 62 (as illustrated in FIG. 1) along the alignment path. Aligning 146 may follow the alignment path until each of the position sensors 66 can observe both reference features of the corresponding alignment pair 72. Once the position sensors 66 may identify relative positions between the reference features of the corresponding alignment pairs 72, the ensuing alignment may follow the feedback procedure as described herein.

Upon completion of the alignment (completing the aligning 146 and achieving the real fit), methods 100 may include finishing steps such as (a) installing 140 the shims 58 between the wing root 20 and the wing stub 30, (b) removing 148 the position sensors 66 from the wing root 20 and/or the wing stub 30, and/or (c) assembling 160 the wing 14 to the body 16.

Examples of inventive subject matter according to the present disclosure are described in the following enumerated paragraphs.

A1. An aircraft wing-to-body join method, the method comprising:

applying photogrammetry targets to a wing root of an aircraft wing and to a wing stub of an aircraft body assembly, wherein the wing root includes at least one wing root interface surface, wherein the wing stub includes at least one wing stub interface surface;

measuring the wing root and the wing stub with a photogrammetry sensor to determine 3D locations of the photogrammetry targets;

generating a wing root 3D surface profile for the at least one wing root interface surface and a wing stub 3D surface profile for the at least one wing stub interface surface by combining scans of a series of wing root inspection regions encompassing the at least one wing root interface surface and combining scans of a series of wing stub inspection regions encompassing the at least one wing stub interface surface, each wing root inspection region including at least two photogrammetry targets, each wing stub inspection region including at least two photogrammetry targets;

calculating a virtual fit between the aircraft wing and the aircraft body assembly that defines one or more gaps between the generated wing root 3D surface profile and the generated wing stub 3D surface profile;

positioning at least three position sensors, wherein each position sensor is positioned within at least one of the wing root and the wing stub, wherein each position sensor is arranged to observe a distinct alignment pair of reference features for each position sensor, wherein each alignment pair of reference features includes a reference feature on the wing root and a reference feature on the wing stub; and aligning the aircraft wing to the aircraft body assembly to achieve a real fit consistent with the calculated virtual fit using feedback from the at least three position sensors regarding relative positions of the reference features of each alignment pair of reference features.

A2. The method of paragraph A1, wherein the photogrammetry sensor is a photogrammetry sensor of a scanning platform, optionally wherein the scanning platform is a mobile scanning platform.

A2.1. The method of paragraph A2, further comprising moving the scanning platform to a wing measurement site, optionally further comprising moving the aircraft wing to the wing measurement site, and optionally wherein the measuring includes measuring the wing root at the wing measurement site.

A2.2. The method of any of paragraphs A2-A2.1, further comprising moving the scanning platform to a body measurement site, optionally further comprising moving the aircraft body assembly to the body measurement site, and optionally wherein the measuring includes measuring the wing stub at the body measurement site.

A2.3. The method of any of paragraphs A2-A2.2, wherein the photogrammetry sensor is a photogrammetry sensor of a mobile scanning platform that includes a carriage, an articulated arm, and a scan head that includes the photogrammetry sensor.

A3. The method of any of paragraphs A1-A2.3, wherein the applying photogrammetry targets includes affixing a wing target fence to the wing root and wherein the wing target fence includes one or more of the photogrammetry targets.

A4. The method of any of paragraphs A1-A3, wherein the applying photogrammetry targets includes affixing a body target fence to the wing stub and wherein the body target fence includes one or more of the photogrammetry targets.

A5. The method of any of paragraphs A1-A4, wherein the photogrammetry targets are each independently at least one of retroreflective targets, coded targets, and fluorescent targets.

A6. The method of any of paragraphs A1-A5, wherein the applying photogrammetry targets includes applying photogrammetry targets at a density of between 1 and 20 photogrammetry targets per square meter of a cross section of the aircraft wing at the wing root and/or applying photogrammetry targets at a density of between 1 and 20 photogrammetry targets per square meter of a cross section of the aircraft wing at the wing root.

A7. The method of any of paragraphs A1-A6, wherein the measuring the wing root and the wing stub includes determining 3D locations of two or more, optionally all, of the photogrammetry targets in a common coordinate system.

A7.1. The method of paragraph A7, wherein the measuring the wing root and the wing stub includes determining 3D locations of all of the photogrammetry targets of the wing root in a first common coordinate system.

A7.2. The method of any of paragraphs A7-A7.1, wherein the measuring the wing root and the wing stub includes determining 3D locations of all of the photogrammetry targets of the wing stub in a second common coordinate system.

A8. The method of any of paragraphs A1-A7.2, wherein the measuring the wing root and the wing stub includes determining relative locations of two or more, optionally all, of the photogrammetry targets.

A8.1. The method of paragraph A8, wherein the measuring the wing root and the wing stub includes determining relative locations of all of the photogrammetry targets of the wing root.

A8.2. The method of any of paragraphs A8-A8.1, wherein the measuring the wing root and the wing stub includes determining relative locations of all of the photogrammetry targets of the wing stub.

A9. The method of any of paragraphs A1-A8.2, wherein the measuring the wing root and the wing stub includes imaging a group of assessment regions.

A9.1. The method of paragraph A9, wherein the group of assessment regions cover the photogrammetry targets.

A9.2. The method of any of paragraphs A9-A9.1, wherein the group of assessment regions are overlapping and wherein each assessment region includes at least one photogrammetry target that is within at least two of the assessment regions.

A10. The method of any of paragraphs A1-A9.2, wherein the generating includes measuring the wing root 3D surface profile and the wing stub 3D surface profile by photogrammetry.

A10.1. The method of paragraph A10, wherein the measuring the wing root 3D surface profile and the wing stub 3D surface profile includes illuminating each wing root inspection region and each wing stub inspection region with a corresponding array of projected features.

A10.1.1. The method of paragraph A10.1, wherein the projected features are selected from the group consisting of spots, lines, and polygons.

A10.1.2. The method of any of paragraphs A10.1-A10.1.1, wherein the illuminating includes illuminating each wing root inspection region and each wing stub inspection region with a corresponding array of projected features at a density of greater than 100, greater than 1,000, or greater than 10,000 projected features per square meter.

A11. The method of any of paragraphs A1-A10.1.2, wherein the generating includes measuring the wing root 3D surface profile and the wing stub 3D surface profile by laser profilometry.

A12. The method of any of paragraphs A1-A11, further comprising determining corresponding shim dimensions of one or more shims to fit between the wing root and the wing stub to fill at least one, optionally each, of the gaps to achieve the calculated virtual fit and/or the real fit.

A12.1. The method of paragraph A12, further comprising forming the shims with the corresponding shim dimensions and optionally installing the shims between the wing root and the wing stub.

A13. The method of any of paragraphs A1-A12.1, wherein the position sensors are at least one of non-contact sensors and optical sensors.

A14. The method of any of paragraphs A1-A13, wherein the position sensors each independently include at least one of a camera and a laser tracker.

A15. The method of any of paragraphs A1-A14, wherein the reference features each independently include at least one of a hole, a slot, a ridge, a groove, a pin, a window, a mark, and a target.

A16. The method of any of paragraphs A1-A15, further comprising, for at least one alignment pair, at least one of (i) applying the reference feature on the wing root to the wing root and (ii) applying the reference feature on the wing stub to the wing stub.

A16.1. The method of paragraph A16, further comprising, for at least one alignment pair, applying the reference feature on the wing root to the wing root and applying the reference feature on the wing stub to the wing stub.

A17. The method of any of paragraphs A1-A16.1, wherein the aligning includes determining an alignment path to move the aircraft wing to the aircraft body assembly and initially moving the aircraft wing along the alignment path until the position sensors observe each reference feature of the respective alignment pair of reference features.

A18. The method of any of paragraphs A1-A17, wherein the aligning includes repeating (i) moving the aircraft wing and (ii) measuring with each position sensor a relative position between reference features of the respective alignment pair in a feedback loop until an error metric related to the relative positions is below a predetermined threshold, and optionally wherein the relative positions each independently include at least one of a relative distance, a relative orientation, and a relative angle.

A19. The method of any of paragraphs A1-A18, wherein the aligning includes supporting the aircraft wing with at least three (optionally three) computer-controlled mobile positioners that are configured to move the aircraft wing along at least three translational directions and about at least three rotational axes, and wherein the aligning includes moving the aircraft wing with the mobile positioners.

A20. The method of any of paragraphs A1-A19, further comprising assembling the aircraft wing to the aircraft body assembly after the real fit is achieved by the aligning.

A21. The method of any of paragraphs A1-A20, further comprising removing the position sensors from the wing root and the wing stub after aligning the aircraft wing to the aircraft body assembly.

B1. An assembly method of joining an aircraft wing to an aircraft body assembly, the method comprising:

virtually fitting the aircraft wing and the aircraft body assembly together based on a measured 3D surface contour of a wing root interface surface of a wing root of the aircraft wing, a measured 3D surface contour of a wing stub interface surface of a wing stub of the aircraft body assembly, and optionally aerodynamic considerations, to generate a virtual fit of the wing root and the wing stub;

installing at least three position sensors within at least one of the wing stub and the wing root, wherein each position sensor is arranged to observe a distinct alignment pair of reference features for each position sensor, wherein each alignment pair of reference features includes a reference feature on the wing root and a reference feature on the wing stub; and aligning the aircraft wing to the aircraft body assembly using position feedback from the position sensors to achieve a real fit consistent with the virtual fit, wherein the position feedback includes, for each alignment pair, a measured relative position between the reference features of the alignment pair, and optionally wherein the relative positions each independently include at least one of a relative distance, a relative orientation, and a relative angle.

B2. The method of paragraph B1, further comprising identifying one or more gaps between the wing root interface surface and the wing stub interface surface in the virtual fit.

B2.1. The method of paragraph B2, further comprising determining corresponding shim dimensions of one or more shims to fit the one or more gaps and optionally forming the shims according to the shim dimensions and further optionally installing the shims between the wing root and the wing stub.

B3. The method of any of paragraphs B1-B2.1, further comprising measuring the 3D surface profile of the wing root interface surface by at least one of optical measurement, machine vision, 3D optical scanning, photogrammetry, and structured light imaging.

B4. The method of any of paragraphs B1-B3, further comprising measuring the 3D surface profile of the wing stub interface surface by at least one of optical measurement, machine vision, 3D optical scanning, photogrammetry, and structured light imaging.

B5. The method of any of paragraphs B1-B4, wherein the position sensors are at least one of non-contact sensors and optical sensors.

B6. The method of any of paragraphs B1-B5, wherein the position sensors each independently include at least one of a camera and a laser tracker.

B7. The method of any of paragraphs B1-B6, wherein the reference features each independently include at least one of a hole, a slot, a ridge, a groove, a pin, a window, a mark, and a target.

B8. The method of any of paragraphs B1-B7, further comprising, for at least one alignment pair, at least one of (i) applying the reference feature on the wing root to the wing root and (ii) applying the reference feature on the wing stub to the wing stub.

B8.1. The method of paragraph B8, further comprising, for at least one alignment pair, applying the reference feature on the wing root to the wing root and applying the reference feature on the wing stub to the wing stub.

B9. The method of any of paragraphs B1-B8.1, wherein the aligning includes determining an alignment path to move the aircraft wing to the aircraft body assembly and initially moving the aircraft wing along the alignment path until the position sensors observe each reference feature of the respective alignment pair of reference features.

B10. The method of any of paragraphs B1-B9, wherein the aligning includes repeating (i) moving the aircraft wing and (ii) measuring with each position sensor a relative position between reference features of the respective alignment pair in a feedback loop until an error metric related to the relative positions is below a predetermined threshold, and optionally wherein the relative positions each independently include at least one of a relative distance, a relative orientation, and a relative angle.

B11. The method of any of paragraphs B1-1310, wherein the aligning includes supporting the aircraft wing with at least three (optionally three) computer-controlled mobile positioners that are configured to move the aircraft wing along at least three translational directions and about at least three rotational axes, and wherein the aligning includes moving the aircraft wing with the mobile positioners.

B12. The method of any of paragraphs B1-B11, further comprising assembling the aircraft wing to the aircraft body assembly after the real fit is achieved by the aligning.

B13. The method of any of paragraphs B1-B12, further comprising removing the position sensors after aligning the aircraft wing to the aircraft body assembly.

C1. An aircraft wing-to-body join method, the method comprising:

applying wing scan targets to a wing root of an aircraft wing, wherein the wing root includes at least one wing root interface surface;

measuring the wing root with a photogrammetry sensor to determine 3D locations of the wing scan targets;

measuring a 3D surface contour of each wing root interface surface by scanning a series of wing root inspection regions of the at least one wing root interface surface with the photogrammetry sensor, wherein each wing root inspection region includes at least two wing scan targets;

combining the 3D surface contours of the at least one wing root interface surface based upon the 3D locations of the wing scan targets to form a complete wing root 3D surface profile of the at least one wing root interface surface;

applying body scan targets to a wing stub of an aircraft body assembly, wherein the wing stub includes at least one wing stub interface surface;

measuring the wing stub with the photogrammetry sensor to determine 3D locations of the body scan targets;

measuring a 3D surface contour of each wing stub interface surface by scanning a series of wing stub inspection regions of the at least one wing stub interface surface with the photogrammetry sensor, wherein each wing stub inspection region includes at least two body scan targets;

combining the 3D surface contours of the at least one wing stub interface surface based upon the 3D locations of the body scan targets to form a complete wing stub 3D surface profile of the at least one wing stub interface surface;

calculating a virtual fit between the aircraft wing and the aircraft body assembly that defines one or more gaps between the at least one wing root interface surface and the at least one wing stub interface surface;

positioning at least three position sensors, wherein each position sensor is positioned within at least one of the wing root and the wing stub, wherein each position sensor is arranged to observe a distinct alignment pair of reference features for each position sensor, wherein each alignment pair of reference features includes a reference feature on the wing root and a reference feature on the wing stub; and aligning the aircraft wing to the aircraft body assembly to achieve a real fit consistent with the virtual fit using feedback from the at least three position sensors regarding relative positions of the reference features of each alignment pair of reference features.

C2. The method of paragraph C1, wherein the photogrammetry sensor is a photogrammetry sensor of a scanning platform, optionally wherein the scanning platform is a mobile scanning platform.

C2.1. The method of paragraph C2, further comprising moving the scanning platform to a wing measurement site, optionally further comprising moving the aircraft wing to the wing measurement site, and optionally wherein the measuring the wing root includes measuring the wing root at the wing measurement site.

C2.2. The method of any of paragraphs C2-C2.1, further comprising moving the scanning platform to a body measurement site, optionally further comprising moving the aircraft body assembly to the body measurement site, and optionally wherein the measuring the wing stub includes measuring the wing stub at the body measurement site.

C2.3. The method of any of paragraphs C2-C2.2, wherein the photogrammetry sensor is a photogrammetry sensor of a mobile scanning platform that includes a carriage, an articulated arm, and a scan head that includes the photogrammetry sensor.

C3. The method of any of paragraphs C1-C2.3, wherein the applying wing scan targets includes affixing a wing target fence to the wing root and wherein the wing target fence includes one or more of the wing scan targets.

C4. The method of any of paragraphs C1-C3, wherein the applying body scan targets includes affixing a body target fence to the wing stub and wherein the body target fence includes one or more of the body scan targets.

C5. The method of any of paragraphs C1-C4, wherein the wing scan targets are each independently at least one of retroreflective targets, coded targets, and fluorescent targets.

C6. The method of any of paragraphs C1-05, wherein the body scan targets are each independently at least one of retroreflective targets, coded targets, and fluorescent targets.

C7. The method of any of paragraphs C1-C6, wherein the applying wing scan targets includes applying wing scan targets at a density of between 1 and 20 wing scan targets per square meter of a cross section of the aircraft wing at the wing root.

C8. The method of any of paragraphs C1-C7, wherein the applying body scan targets includes applying body scan targets at a density of between 1 and 20 body targets per square meter of a cross section of the aircraft wing at the wing root.

C9. The method of any of paragraphs C1-C8, wherein the measuring the wing root includes determining the 3D locations of the wing scan targets in a common coordinate system.

C10. The method of any of paragraphs C1-C9, wherein the measuring the wing root includes determining relative locations of the wing scan targets.

C11. The method of any of paragraphs C1-C10, wherein the measuring the wing stub includes determining the 3D locations of the body scan targets in a/the common coordinate system.

C12. The method of any of paragraphs C1-C11, wherein the measuring the wing stub includes determining relative locations of the body scan targets.

C13. The method of any of paragraphs C1-C12, wherein the measuring the wing root includes measuring by photogrammetry.

C14. The method of any of paragraphs C1-C13, wherein the measuring the wing stub includes measuring by photogrammetry.

C15. The method of any of paragraphs C1-C14, wherein the measuring the wing root includes imaging a group of wing root assessment regions.

C15.1. The method of paragraph C15, wherein the group of wing root assessment regions cover the wing scan targets.

C15.2. The method of any of paragraphs C15-C15.1, wherein the group of wing root assessment regions are overlapping and wherein each wing root assessment region includes at least one wing scan target that is within at least two of the wing root assessment regions.

C16. The method of any of paragraphs C1-C15.2, wherein the measuring the wing stub includes imaging a group of wing stub assessment regions.

C16.1. The method of paragraph C16, wherein the group of wing stub assessment regions cover the body scan targets.

C16.2. The method of any of paragraphs C16-C16.1, wherein the group of wing stub assessment regions are overlapping and wherein each wing stub assessment region includes at least one body scan target that is within at least two of the wing stub assessment regions.

C17. The method of any of paragraphs C1-C16.2, wherein the measuring the 3D surface contour of each wing root interface surface includes illuminating each wing root inspection region of the at least one wing root interface surface with a corresponding array of projected features.

C17.1. The method of paragraph C17, wherein the projected features illuminating each wing root inspection region are selected from the group consisting of spots, lines, and polygons.

C17.2. The method of any of paragraphs C17-C17.1, wherein the illuminating each wing root inspection region includes illuminating each wing root inspection region with a corresponding array of projected features at a density of greater than 100, greater than 1,000, or greater than 10,000 projected features per square meter of the respective wing root inspection region.

C18. The method of any of paragraphs C1-C17.2, wherein the measuring the 3D surface contour of each wing stub interface surface includes illuminating each wing stub inspection region of the at least one wing stub interface surface with a corresponding array of projected features.

C18.1. The method of paragraph C18, wherein the projected features illuminating each wing stub inspection region are selected from the group consisting of spots, lines, and polygons.

C18.2. The method of any of paragraphs C18-C18.1, wherein the illuminating each wing stub inspection region includes illuminating each wing stub inspection region with a corresponding array of projected features at a density of greater than 100, greater than 1,000, or greater than 10,000 projected features per square meter of the respective wing stub inspection region.

C19. The method of any of paragraphs C1-C18.2, further comprising determining corresponding shim dimensions of one or more shims to fit between the wing root and the wing stub to fill at least one, optionally each, of the gaps to achieve the virtual fit and/or the real fit.

C19.1. The method of paragraph C19, further comprising forming the shims with the corresponding shim dimensions and optionally installing the shims between the wing root and the wing stub.

C20. The method of any of paragraphs C1-C19.1, wherein the position sensors are at least one of non-contact sensors and optical sensors.

C21. The method of any of paragraphs C1-C20, wherein the position sensors each independently include at least one of a camera and a laser tracker.

C22. The method of any of paragraphs C1-C21, wherein the reference features each independently include at least one of a hole, a slot, a ridge, a groove, a pin, a window, a mark, and a target.

C23. The method of any of paragraphs C1-C22, further comprising, for at least one alignment pair, at least one of (i) applying the reference feature on the wing root to the wing root and (ii) applying the reference feature on the wing stub to the wing stub.

C23.1. The method of paragraph C23, further comprising, for at least one alignment pair, applying the reference feature on the wing root to the wing root and applying the reference feature on the wing stub to the wing stub.

C24. The method of any of paragraphs C1-C23.1, wherein the aligning includes determining an alignment path to move the aircraft wing to the aircraft body assembly and initially moving the aircraft wing along the alignment path until the position sensors observe each reference feature of the respective alignment pair of reference features.

C25. The method of any of paragraphs C1-C24, wherein the aligning includes repeating (i) moving the aircraft wing and (ii) measuring with each position sensor a relative position between reference features of the respective alignment pair in a feedback loop until an error metric related to the relative positions is below a predetermined threshold, and optionally wherein the relative positions each independently include at least one of a relative distance, a relative orientation, and a relative angle.

C26. The method of any of paragraphs C1-C25, wherein the aligning includes supporting the aircraft wing with at least three (optionally three) computer-controlled mobile positioners that are configured to move the aircraft wing along at least three translational directions and about at least three rotational axes, and wherein the aligning includes moving the aircraft wing with the mobile positioners.

C27. The method of any of paragraphs C1-C26, further comprising assembling the aircraft wing to the aircraft body assembly after the real fit is achieved by the aligning.

C28. The method of any of paragraphs C1-C27, further comprising removing the position sensors from the wing root and the wing stub after aligning the aircraft wing to the aircraft body assembly.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, the phrases "at least one of" and "one or more of," in reference to a list of more than one entity, means any one or more of the entities in the list of entities, and is not limited to at least one of each and every entity specifically listed within the list of entities. For example, "at least one of A and B" (or, equivalently, "at least one of A or B," or, equivalently, "at least one of A and/or B") may refer to A alone, B alone, or the combination of A and B.

As used herein, the singular forms "a", "an" and "the" may be intended to include the plural forms as well, unless the context clearly indicates otherwise.

The various disclosed elements of systems and steps of methods disclosed herein are not required of all systems, apparatuses, and methods according to the present disclosure, and the present disclosure includes all novel and non-obvious combinations and subcombinations of the various elements and steps disclosed herein. Moreover, any of the various elements and steps, or any combination of the various elements and/or steps, disclosed herein may define independent inventive subject matter that is separate and apart from the whole of a disclosed system, apparatus, or method. Accordingly, such inventive subject matter is not required to be associated with the specific systems, apparatuses, and methods that are expressly disclosed herein, and such inventive subject matter may find utility in systems, apparatuses, and/or methods that are not expressly disclosed herein.

The invention claimed is:

1. An aircraft wing-to-body join method, the method comprising:
    measuring a wing root of an aircraft wing with a photogrammetry sensor, wherein the wing root includes at least one wing root interface surface;
    measuring a 3D surface contour of each wing root interface surface;
    combining the 3D surface contours of the at least one wing root interface surface to form a complete wing root 3D surface profile of the at least one wing root interface surface;
    measuring a wing stub of an aircraft body assembly with the photogrammetry sensor, wherein the wing stub includes at least one wing stub interface surface;
    measuring a 3D surface contour of each wing stub interface surface by scanning a series of wing stub inspection regions of the at least one wing stub interface surface with the photogrammetry sensor;
    combining the 3D surface contours of the at least one wing stub interface surface to form a complete wing stub 3D surface profile of the at least one wing stub interface surface;

calculating a virtual fit between the aircraft wing and the aircraft body assembly that defines one or more gaps between the at least one wing root interface surface and the at least one wing stub interface surface; and aligning the aircraft wing to the aircraft body assembly to achieve a real fit consistent with the virtual fit.

2. The method of claim 1, further comprising applying wing scan targets to the wing root of the aircraft wing;

wherein the measuring the wing root of the aircraft wing is performed to determine 3D locations of the wing scan targets;

wherein the measuring the 3D surface contours of each wing root interface surface comprises scanning a series of wing root inspection regions of the at least one wing root interface surface with the photogrammetry sensor, wherein each wing root inspection region includes at least two wing scan targets; and wherein the combining the 3D surface contour of the at least one wing root interface surface is based upon the 3D locations of the wing scan targets.

3. The method of claim 2, wherein the applying wing scan targets includes affixing a wing target fence to the wing root and wherein the wing target fence includes one or more of the wing scan targets.

4. The method of claim 2, wherein the applying wing scan targets includes applying wing scan targets at a density of between 1 and 20 wing scan targets per square meter of a cross section of the aircraft wing at the wing root.

5. The method of claim 2, wherein the measuring the wing root includes determining the 3D locations of the wing scan targets in a common coordinate system.

6. The method of claim 2, wherein the measuring the wing root includes determining relative locations of the wing scan targets.

7. The method of claim 2, wherein the measuring the wing root includes imaging a group of wing root assessment regions, and the wing root assessment regions cover the wing scan targets.

8. The method of claim 7, wherein the wing root assessment regions are overlapping, and wherein each wing root assessment region includes at least one wing scan target that is within at least two of the wing root assessment regions.

9. The method of claim 1, further comprising applying body scan targets to a wing stub of an aircraft body assembly;

wherein measuring the wing stub with the photogrammetry sensor is performed to determine 3D locations of the body scan targets;

wherein each wing stub inspection region includes at least two body scan targets; and wherein the combining the 3D surface contours of the at least one wing stub interface surface is based upon the 3D locations of the body scan targets.

10. The method of claim 9, wherein the applying body scan targets includes affixing a body target fence to the wing stub and wherein the body target fence includes one or more of the body scan targets.

11. The method of claim 9, wherein the applying body scan targets includes applying body scan targets at a density of between 1 and 20 body targets per square meter of a cross section of the aircraft wing at the wing root.

12. The method of claim 9, wherein the measuring the wing stub includes determining the 3D locations of the body scan targets in a common coordinate system.

13. The method of claim 9, wherein the measuring the wing stub includes determining relative locations of the body scan targets.

14. The method of claim 9, wherein the measuring the wing stub includes imaging a group of wing stub assessment regions, and wherein the wing stub assessment regions cover the body scan targets.

15. The method of claim 14, wherein the wing stub assessment regions are overlapping, and wherein each wing stub assessment region includes at least one body scan target that is within at least two of the wing stub assessment regions.

16. The method of claim 1, further comprising:

positioning at least three position sensors, wherein each position sensor is positioned within at least one of the wing root and the wing stub, wherein each position sensor is arranged to observe a distinct alignment pair of reference features for each position sensor, wherein each alignment pair of reference features includes a reference feature on the wing root and a reference feature on the wing stub; and using feedback from the at least three position sensors regarding relative positions of the reference features of each alignment pair of reference features.

17. The method of claim 16, further comprising, for at least one alignment pair of reference features, at least one of (i) applying the reference feature on the wing root to the wing root and (ii) applying the reference feature on the wing stub to the wing stub.

18. The method of claim 16, wherein the aligning includes determining an alignment path to move the aircraft wing to the aircraft body assembly and initially moving the aircraft wing along the alignment path until the position sensors observe each reference feature of the respective alignment pair of reference features.

19. The method of claim 16, wherein the aligning includes repeating (i) moving the aircraft wing and (ii) measuring with each position sensor a relative position between reference features of the respective alignment pair of reference features in a feedback loop until an error metric related to the relative positions is below a predetermined threshold.

20. The method of claim 1, wherein the measuring the 3D surface contour of each wing root interface surface includes illuminating each wing root inspection region of the at least one wing root interface surface with a corresponding array of projected features.

21. The method of claim 20, wherein the projected features illuminating each wing root inspection region are selected from the group consisting of spots, lines, and polygons.

22. The method of claim 20, wherein the illuminating each wing root inspection region includes illuminating each wing root inspection region with the corresponding array of projected features at a density of greater than 100 projected features per square meter of the respective wing root inspection region.

23. The method of claim 1, wherein the measuring the 3D surface contour of each wing stub interface surface includes illuminating each wing stub inspection region of the at least one wing stub interface surface with a corresponding array of projected features.

24. The method of claim 23, wherein the projected features illuminating each wing stub inspection region are selected from the group consisting of spots, lines, and polygons.

25. The method of claim 23, wherein the illuminating each wing stub inspection region includes illuminating each wing stub inspection region with the corresponding array of projected features at a density of greater than 100 projected features per square meter of the respective wing stub inspection region.

26. The method of claim 1, further comprising determining corresponding shim dimensions of one or more shims to fit between the wing root and the wing stub to fill at least one of the gaps to achieve the real fit.

27. The method of claim 26, further comprising forming the shims with the corresponding shim dimensions and installing the shims between the wing root and the wing stub.

* * * * *